US012747154B2

(12) United States Patent
Li et al.

(10) Patent No.: US 12,747,154 B2
(45) Date of Patent: Sep. 29, 2026

(54) MICRO-ELECTRO-MECHANICAL SYSTEM AND MANUFACTURING METHOD THEREOF

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Wenbo Li, Beijing (CN); Hanbing Zhang, Beijing (CN); Long Wang, Beijing (CN); Jindou Liu, Beijing (CN); Yanzhao Li, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 460 days.

(21) Appl. No.: 18/563,496

(22) PCT Filed: Nov. 30, 2022

(86) PCT No.: PCT/CN2022/135547
§ 371 (c)(1),
(2) Date: Nov. 22, 2023

(87) PCT Pub. No.: WO2024/113244
PCT Pub. Date: Jun. 6, 2024

(65) Prior Publication Data

US 2025/0074764 A1 Mar. 6, 2025

(51) Int. Cl.
*B81B 3/00* (2006.01)
*B81C 1/00* (2006.01)

(52) U.S. Cl.
CPC ........ *B81B 3/0086* (2013.01); *B81C 1/00698* (2013.01); *B81B 2203/0118* (2013.01);
(Continued)

(58) Field of Classification Search
CPC ........... B81B 3/0086; B81B 2203/0118; B81B 2203/0136; B81B 2203/0163;
(Continued)

(56) References Cited

U.S. PATENT DOCUMENTS 6,507,138 B1 1/2003 Rodgers et al.
6,845,668 B2 1/2005 Kim et al.
(Continued)

FOREIGN PATENT DOCUMENTS

CN 1370284 A 9/2002
CN 1457319 A 11/2003
(Continued)

*Primary Examiner* — Nathan W Ha

(57) ABSTRACT

A micro-electro-mechanical system and a manufacturing method thereof. The micro-electro-mechanical system includes a comb tooth structure, a spring structure, and an electrode structure. The comb tooth structure includes first comb teeth and second comb teeth arranged alternately. A cantilever beam connecting the second comb teeth is connected to the spring structure; line widths of a first comb tooth and a second comb tooth are 3-7 microns, and are not less than a distance between the adjacent first comb tooth and the second comb tooth a ratio of the length of the first comb tooth to a length of the second comb tooth is 0.7-1.5, a width of the cantilever beam is not less than the line width of the second comb tooth, and thickness of the first comb tooth and a thickness of the second comb tooth are both 300 nanometers to 500 microns.

20 Claims, 11 Drawing Sheets

(52) U.S. Cl.
CPC ................. *B81B 2203/0136* (2013.01); *B81B 2203/0163* (2013.01); *B81B 2203/04* (2013.01); *B81B 2207/07* (2013.01); *B81C 2201/0105* (2013.01); *B81C 2201/0132* (2013.01); *B81C 2201/0174* (2013.01); *B81C 2201/0198* (2013.01)

(58) Field of Classification Search
CPC ........ B81C 1/00698; B81C 2201/0105; B81C 2201/0132
See application file for complete search history.

(56) References Cited

U.S. PATENT DOCUMENTS

| | | | | |
|---|---|---|---|---|
| 7,063,796 | B2 * | 6/2006 | Lutz | B81C 1/00293 216/36 |
| 7,129,617 | B2 | 10/2006 | Hong | |
| 7,312,553 | B2 * | 12/2007 | Laermer | B81C 1/00801 73/514.01 |
| 8,049,944 | B2 | 11/2011 | Moidu | |
| 8,210,038 | B2 | 7/2012 | Rocznik | |
| 8,508,910 | B2 | 8/2013 | Mi et al. | |
| 9,493,344 | B2 | 11/2016 | Horning et al. | |
| 12,504,283 | B2 * | 12/2025 | Piirainen | G01C 19/5712 |
| 12,535,445 | B2 * | 1/2026 | Yamazaki | G01N 27/18 |
| 2001/0008457 | A1 | 7/2001 | Zhang | |
| 2004/0060898 | A1 | 4/2004 | Tsai | |
| 2007/0284964 | A1 * | 12/2007 | Chung | B81B 3/0086 359/224.1 |
| 2011/0080627 | A1 | 4/2011 | He et al. | |
| 2013/0147313 | A1 | 6/2013 | Sachse | |
| 2014/0376069 | A1 * | 12/2014 | Reinmuth | G02B 26/0841 29/825 |
| 2024/0182296 | A1 * | 6/2024 | Classen | G01P 15/18 |
| 2025/0011157 | A1 * | 1/2025 | Senger | H02N 2/188 |
| 2025/0326628 | A1 * | 10/2025 | Shibano | B81B 3/007 |

FOREIGN PATENT DOCUMENTS

| | | | |
|---|---|---|---|
| CN | 1702489 | A | 11/2005 |
| CN | 101059557 | A | 10/2007 |
| CN | 101196613 | A | 6/2008 |
| CN | 102194572 | A | 9/2011 |
| CN | 102356300 | A | 2/2012 |
| CN | 102564469 | A | 7/2012 |
| CN | 102998745 | A | 3/2013 |
| CN | 105607249 | A | 5/2016 |
| CN | 109399549 | A | 3/2019 |
| CN | 217718105 | U | 11/2022 |
| EP | 3 868 706 | A1 | 8/2021 |
| JP | 2004264701 | A | 9/2004 |

* cited by examiner

MICRO-ELECTRO-MECHANICAL SYSTEM AND MANUFACTURING METHOD THEREOF

This application is a National Stage of International Application No. PCT/CN2022/135547, filed Nov. 30, 2022, the entirety of which is hereby incorporated herein by reference.

TECHNICAL FIELD

Embodiments of the present disclosure relate to a micro-electro-mechanical system and a manufacturing method thereof.

BACKGROUND

A micro-electro-mechanical system (MEMS) may be a micron-scale structure formed by processing on a semiconductor substrate such as a silicon substrate, for example, the MEMS includes fixed comb teeth and movable comb teeth, and is currently widely used in devices such as optical switches, sensors, filters, etc.

SUMMARY

Embodiments of the present disclosure provide a micro-electro-mechanical system, the micro-electro-mechanical system comprises: a comb tooth structure, a spring structure, and an electrode structure, the comb tooth structure comprises a first comb tooth portion and a second comb tooth portion, the first comb tooth portion comprises a plurality of first comb teeth arranged along a first direction and extending along a second direction, the second comb tooth portion comprises a plurality of second comb teeth arranged along the first direction and extending along the second direction, at least part of the plurality of second comb teeth are in intervals of the plurality of first comb teeth so that the plurality of first comb teeth and at least part of the plurality of second comb teeth are arranged alternately, the second comb tooth portion is a suspended structure and configured to be movable in the second direction relative to the first comb tooth portion, and the first direction intersects with the second direction; the spring structure is connected to the second comb tooth portion; the electrode structure comprises a first electrode, a second electrode, a first electrode line and a second electrode line, the first electrode is electrically connected to the first comb tooth portion through the first electrode line, and the second electrode is electrically connected to the second comb tooth portion through the second electrode line. The second comb tooth portion further comprises a cantilever beam connecting the plurality of second comb teeth, and the cantilever beam is connected to the spring structure; a line width of a first comb tooth and a line width of a second comb tooth are both 3-7 microns, both the line width of the first comb tooth and the line width of the second comb tooth are not less than a distance between the first comb tooth and the second comb tooth that are adjacent, a ratio of a length of an overlapping portion of orthographic projections, on a plane, of the first comb tooth and the second comb tooth that are adjacent to a length of the first comb tooth is 5%-50%, a ratio of the length of the first comb tooth to a length of the second comb tooth is 0.7-1.5, a width of the cantilever beam is not less than the line width of the second comb tooth, a thickness of the first comb tooth and a thickness of the second comb tooth are both 300 nanometers to 500 microns, and the plane is parallel to the second direction and perpendicular to the first direction.

For example, according to the embodiments of the present disclosure, a line width of the first electrode line and a line width of the second electrode line are both more than 10 times the width of the cantilever beam, and a maximum size of the first electrode and a maximum size of the second electrode are both 1-50 mm.

For example, according to the embodiments of the present disclosure, the distance between the first comb tooth and the second comb tooth that are adjacent is 2-4 microns.

For example, according to the embodiments of the present disclosure, the spring structure comprises a spring body on either side of the cantilever beam in the first direction, the spring body is connected to the cantilever beam, and the spring body is a suspended structure; the spring body extends along the first direction, a line width of the spring body is 3-5 microns, a ratio of a length of a spring body on a same side of the cantilever beam to a length of the cantilever beam is 0.5-3, and a total number of the spring body on the same side of the cantilever beam is 1-6.

For example, according to the embodiments of the present disclosure, the spring structure is a conductive structure, the spring structure further comprises a fixing portion connected to an end of the spring body away from the cantilever beam, and two ends of the second electrode line are electrically connected to the second electrode and the fixing portion, respectively; and a ratio of a size of the fixing portion in the first direction to a line width of the second electrode line is not less than 2.

For example, according to the embodiments of the present disclosure, a line width of at least a partial position of at least one first comb tooth is greater than a line width of the at least one second comb tooth; and/or, a thickness of at least a partial position of at least one first comb tooth is greater than a thickness of at least one second comb tooth.

For example, according to the embodiments of the present disclosure, the first comb tooth portion further comprises a support portion connected to the plurality of first comb teeth, and a ratio of a size of the support portion in the second direction to the line width of the first comb tooth is not less than 5.

For example, according to the embodiments of the present disclosure, the cantilever beam is provided with at least one first via, a maximum size of an orthographic projection of the first via on a plane parallel to the first direction and the second direction is not less than 3 microns, and a distance between an edge of the first via and any edge of the cantilever beam is greater than 2 microns.

For example, according to the embodiments of the present disclosure, a baffle is provided on a side of the cantilever beam away from the plurality of second comb teeth, the baffle is a suspended structure, the baffle is provided with at least one second via, and a maximum size of an orthographic projection of the second via on a plane parallel to the first direction and the second direction is not less than 3 microns.

For example, according to the embodiments of the present disclosure, a plurality of notches are provided on at least one side edge, extending along the second direction, of at least one of at least one kind of the plurality of first comb teeth and the plurality of second comb teeth, and the plurality of notches are provided evenly.

For example, according to the embodiments of the present disclosure, the electrode structure comprises a metal layer, a first functional layer, and a sacrificial layer stacked sequentially, the second comb tooth portion comprises a second functional layer, the first functional layer and the second functional layer are provided in a same layer and made of a same material, and resistivities of both the first functional layer and the second functional layer are not greater than 0.015 ohm·cm.

For example, according to the embodiments of the present disclosure, the electrode structure comprises a first metal layer, a first functional layer, and a sacrificial layer stacked sequentially, the second comb tooth portion comprises a second metal layer and a second functional layer stacked with each other, the first metal layer and the second metal layer are provided in a same layer and made of a same material, and the first functional layer and the second functional layer are provided in a same layer and made of a same material.

For example, according to the embodiments of the present disclosure, the electrode structure comprises a first functional layer and a sacrificial layer stacked sequentially, the second comb tooth portion comprises a second functional layer, the first functional layer and the second functional layer are provided in a same layer and made of a same material, and resistivities of both the first functional layer and the second functional layer are not greater than 0.015 ohm·cm.

For example, according to the embodiments of the present disclosure, the electrode structure comprises a first functional layer and a sacrificial layer stacked with each other, and a first metal layer is provided on a side surface of the first functional layer away from the sacrificial layer and on at least part of a side surface of the first functional layer; the second comb tooth portion comprises a second functional layer and a second metal layer stacked with each other, and the second metal layer is provided on at least part of a side surface of the second functional layer; and the first functional layer and the second functional layer are provided in a same layer and made of a same material, and the first metal layer and the second metal layer are made of a same material.

For example, according to the embodiments of the present disclosure, resistivities of both the first functional layer and the second functional layer are 1-10 ohm·cm.

Embodiments of the present disclosure provide a manufacturing method for manufacturing the micro-electro-mechanical system according to claim 1, the manufacturing method comprises: providing a substrate, wherein the substrate comprises a bottom layer, a sacrificial material layer, and a functional material layer stacked sequentially; and patterning the substrate to form the comb tooth structure, the spring structure and the electrode structure.

For example, according to the embodiments of the present disclosure, patterning the substrate to form the comb tooth structure, the spring structure and the electrode structure comprises: forming a metal material layer on a side of the functional material layer away from the sacrificial material layer; patterning the metal material layer to form a metal layer of the electrode structure; patterning the functional material layer at positions other than the metal layer to form a first functional layer of the electrode structure and a second functional layer of the second comb tooth portion, wherein resistivities of both the first functional layer and the second functional layer are not greater than 0.015 ohm·cm; and etching the sacrificial material layer between the second functional layer and the bottom layer to remove the sacrificial material layer between the second functional layer and the bottom layer while retaining a sacrificial layer of the electrode structure.

For example, according to the embodiments of the present disclosure, patterning the substrate to form the comb tooth structure, the spring structure and the electrode structure comprises: forming a mask layer in a region on a side of the functional material layer away from the sacrificial material layer, wherein the side of the functional material layer away from the sacrificial material layer comprises a first region and a second region, and the region is the second region; forming a metal material layer in the first region and the second region; removing the mask layer and a portion of the metal material layer on the mask layer, and retaining a portion of the metal material layer in the first region to form a metal layer of the electrode structure; patterning the functional material layer at positions other than the metal layer to form a first functional layer of the electrode structure and a second functional layer of the second comb tooth portion, wherein the second comb tooth portion is in the second region, and resistivities of both the first functional layer and the second functional layer are not greater than 0.015 ohm·cm; and etching the sacrificial material layer between the second functional layer and the bottom layer to remove the sacrificial material layer between the second functional layer and the bottom layer while retaining a sacrificial layer of the electrode structure.

For example, according to the embodiments of the present disclosure, patterning the substrate to form the comb tooth structure, the spring structure and the electrode structure comprises: forming a metal material layer on a side of the functional material layer away from the sacrificial material layer; patterning the metal material layer to form a first metal layer of the electrode structure and a second metal layer of the second comb tooth portion; patterning the functional material layer at positions other than the first metal layer and the second metal layer to form a first functional layer of the electrode structure and a second functional layer of the second comb tooth portion; and etching the sacrificial material layer between the second functional layer and the bottom layer to remove the sacrificial material layer between the second functional layer and the bottom layer while retaining a sacrificial layer of the electrode structure.

For example, according to the embodiments of the present disclosure, patterning the substrate to form the comb tooth structure, the spring structure and the electrode structure comprises: patterning the functional material layer to form a first functional layer of the electrode structure and a second functional layer of the second comb tooth portion, wherein resistivities of both the first functional layer and the second functional layer are not greater than 0.015 ohm·cm; and etching the sacrificial material layer between the second functional layer and the bottom layer to remove the sacrificial material layer between the second functional layer and the bottom layer while retaining a sacrificial layer of the electrode structure.

For example, according to the embodiments of the present disclosure, patterning the substrate to form the comb tooth structure, the spring structure and the electrode structure comprises: patterning the functional material layer to form a first functional layer of the electrode structure and a second functional layer of the second comb tooth portion; forming a metal material layer on the first functional layer and the second functional layer; patterning the metal material layer to form a first metal layer of the electrode structure and a second metal layer of the second comb tooth portion, wherein the first metal layer is on a surface of the first functional layer away from the bottom layer and on at least part of a side surface of the first functional layer, and the second metal layer is on a surface of the second functional layer away from the bottom layer and on at least part of a side surface of the second functional layer; and etching the sacrificial material layer between the second functional layer and the bottom layer to remove the sacrificial material layer between the second functional layer and the bottom layer while retaining a sacrificial layer of the electrode structure.

BRIEF DESCRIPTION OF DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

Figure 1:
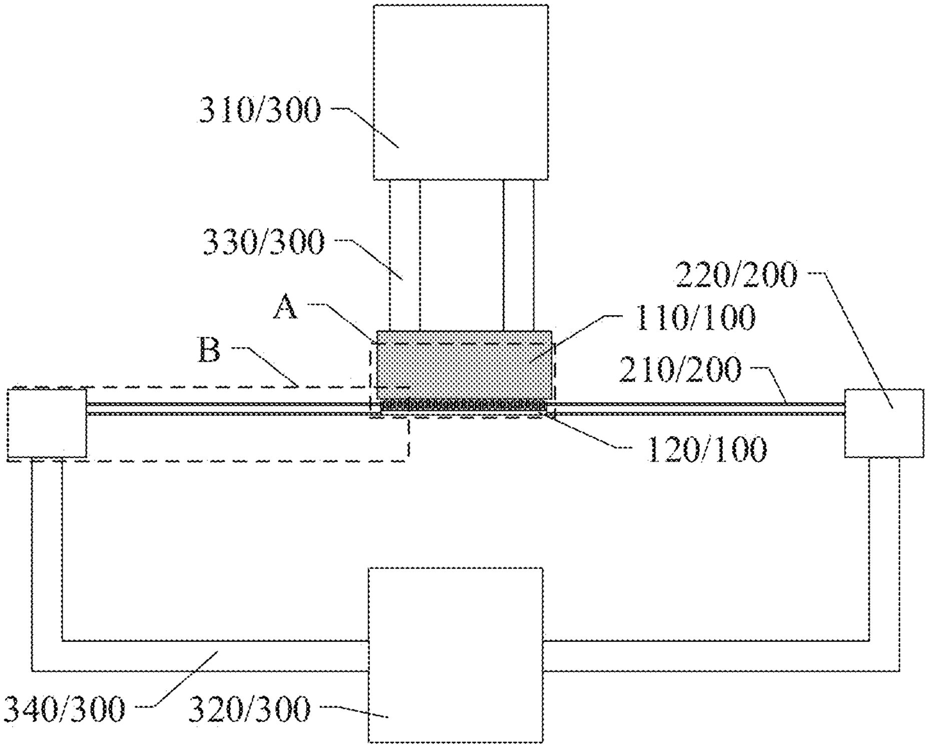
FIG. 1 is a schematic structural view of a micro-electro-mechanical system provided according to an example of the embodiments of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms “first,” “second,” etc., which are used in the present disclosure, are not intended to indicate any sequence, amount or importance, but distinguish various components. The terms “comprise,” “comprising,” “include,” “including,” etc., are intended to specify that the elements or the objects stated before these terms encompass the elements or the objects and equivalents thereof listed after these terms, but do not preclude the other elements or objects.

Features such as “parallel”, “vertical/perpendicular” and “identical/same” used in the embodiments of the present disclosure include features such as “parallel”, “vertical/perpendicular” and “identical/same” in the strict sense, as well as “approximately parallel”, “approximately vertical” and “approximately identical/same” and other situations that contain certain errors. Considering the measurement and errors associated with a specific amount of measurement (that is, the limitation of the measurement system), the features include the cases within an acceptable deviation range for specific values determined by those skilled in the art. For example, “approximately” can mean within one or more standard deviations, or within 10% or 5% of the value. In the case where the quantity of a component is not specifically indicated below in the embodiments of the present disclosure, it means that the component may be one or more, or may be understood as at least one. “At least one” means one or more, and “plurality” means at least two.

The embodiments of the present disclosure provide a micro-electro-mechanical system and a manufacturing method thereof. The micro-electro-mechanical system includes a comb tooth structure, a spring structure and an electrode structure. The comb tooth structure includes a first comb tooth portion and a second comb tooth portion, the first comb tooth portion includes a plurality of first comb teeth arranged along a first direction and extending along a second direction, the second comb tooth portion includes a plurality of second comb teeth arranged along the first direction and extending along the second direction, at least part of the plurality of second comb teeth are inserted in intervals of the plurality of first comb teeth so that the plurality of first comb teeth and at least part of the plurality of second comb teeth are arranged alternately, and the second comb tooth portion is a suspended structure and configured to be movable in the second direction relative to the first comb tooth portion; the spring structure is connected to the second comb tooth portion; the electrode structure includes a first electrode, a second electrode, a first electrode line and a second electrode line, the first electrode is electrically connected to the first comb tooth portion through the first electrode line, and the second electrode is electrically connected to the second comb tooth portion through the second electrode line. The second comb tooth portion further includes a cantilever beam connecting the plurality of second comb teeth, and the cantilever beam is connected to the spring structure; a line width of a first comb tooth and a line width of a second comb tooth are both 3-7 microns, both the line width of the first comb tooth and the line width of the second comb tooth are not less than a distance between the first comb tooth and the second comb tooth that are adjacent, a ratio of a length of an overlapping portion of orthographic projections, on a plane, of the first comb tooth and the second comb tooth that are adjacent to a length of the first comb tooth is 5%-50%, a ratio of the length of the first comb tooth to a length of the second comb tooth is 0.7-1.5, a width of the cantilever beam is not less than the line width of the second comb tooth, and a thickness of the first comb tooth and a thickness of the second comb tooth are both 300 nanometers to 500 microns.

The micro-electro-mechanical system provided by the present disclosure can balance the electrostatic driving force of the micro-electro-mechanical system and the stability of the second comb teeth by setting parameters such as the line width of the first comb tooth and the line width of the second comb tooth, the relationship between the distance between the first comb tooth and the second comb tooth and the line width of the second comb tooth, the relationship between the dimension of the overlapping portion of the first comb tooth and the second comb tooth and the length of the first comb tooth, the relationship between the width of the cantilever beam and the line width of the second comb tooth, the thickness of the first comb tooth and the thickness of the second comb tooth, etc.

The micro-electro-mechanical system and the manufacturing method thereof provided by the embodiments of the present disclosure will be described below with reference to the drawings.

Figure 2A:
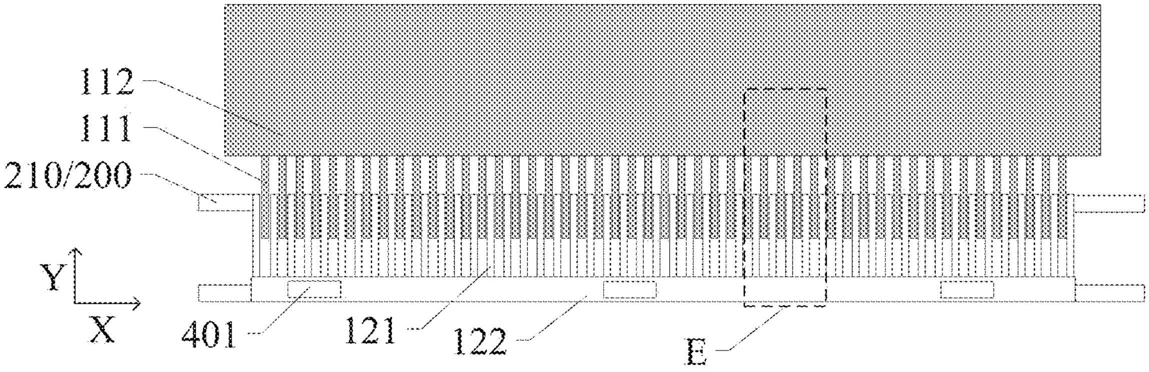
FIG. 2A is a partially enlarged view of a region A in an example of the micro-electro-mechanical system illustrated in FIG. 1.
Figure 2B:
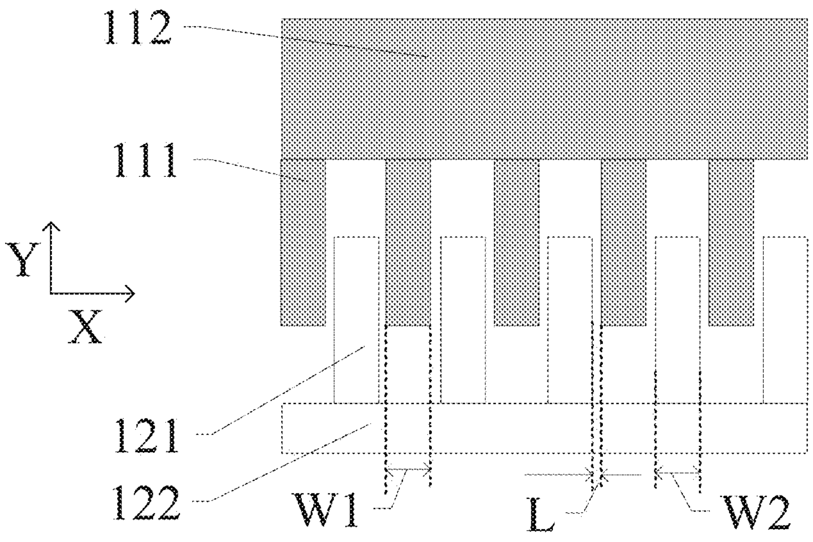
FIG. 2B is an enlarged view of a region E illustrated in FIG. 2A.

FIG. 1 is a schematic structural view of a micro-electro-mechanical system provided according to an example of the embodiments of the present disclosure, FIG. 2A is a partially enlarged view of a region A in an example of the micro-electro-mechanical system illustrated in FIG. 1, and FIG. 2B is an enlarged view of a region E illustrated in FIG. 2A. As illustrated in FIG. 1 and FIG. 2A, the micro-electro-mechanical system includes a comb tooth structure 100, a spring structure 200 and an electrode structure 300. The comb tooth structure 100 includes a first comb tooth portion 110 and a second comb tooth portion 120, the first comb tooth portion 110 includes a plurality of first comb teeth 111 arranged along a first direction and extending along a second direction, the second comb tooth portion 120 includes a plurality of second comb teeth 121 arranged along the first direction and extending along the second direction, and the first direction intersects with the second direction. FIG. 2A schematically illustrates that the first direction is the X direction, and the second direction is the Y direction, but the embodiments are not limited thereto, the first direction and the second direction can be interchanged. For example, the included angle between the first direction and the second direction may be 80-100 degrees. For example, the first direction is perpendicular to the second direction. FIG. 2A schematically illustrates that the second direction is an extension direction of a straight line, the first comb tooth and the second comb tooth are linear, but the embodiments are not limited thereto, the second direction may also be an extension direction of a curved segment, and both the first comb tooth and the second comb tooth may be curved lines, such as arcs, waves, etc.

As illustrated in FIG. 1 and FIG. 2A, at least part of the plurality of second comb teeth 121 are in intervals of the plurality of first comb teeth 111 so that the plurality of first comb teeth 111 and at least part of the plurality of second comb teeth 121 are arranged alternately. For example, the plurality of first comb teeth 111 are inserted into intervals of the plurality of second comb teeth 121 so that the plurality of first comb teeth 111 and the plurality of second comb teeth 121 are arranged alternately along the first direction.

As illustrated in FIG. 1 and FIG. 2A, the second comb tooth portion 120 is a suspended structure and configured to be movable in the second direction relative to the first comb tooth portion 110. For example, the first comb teeth 111 may be fixed teeth, the second comb teeth 121 may be movable teeth, and the second comb teeth 121 are configured to move toward the first comb teeth 111 or move away from the first comb teeth 111. The "suspended structure" described above and below means that the structure is not in contact with at least one film layer in a direction perpendicular to the XY plane, for example, the second comb tooth portion can be movable relative to a bottom layer (a bottom layer 610 illustrated in FIG. 9) under the second comb tooth portion.

As illustrated in FIG. 1 and FIG. 2A, the spring structure 200 is connected to the second comb tooth portion 120. The second comb tooth portion 120 further includes a cantilever beam 122 connecting the plurality of second comb teeth 121, and the cantilever beam 122 is connected to the spring structure 200.

As illustrated in FIG. 1 and FIG. 2A, the electrode structure 300 includes a first electrode 310, a second electrode 320, a first electrode line 330 and a second electrode line 340, the first electrode 310 is electrically connected to the first comb tooth portion 110 through the first electrode line 330, and the second electrode 320 is electrically connected to the second comb tooth portion 120 through the second electrode line 340. When the electrode structure applies a driving voltage to the comb tooth structure, an electrostatic driving force is generated between the first comb tooth and the second comb tooth, so that the second comb tooth moves in a direction close to the first comb tooth. For example, the electrical signal input to the electrode structure may be a direct current signal, such as a square wave signal (the voltage varies between 0V-nV, n is greater than 0, or n is less than 0), or a sine wave signal, etc., which is not limited in the embodiments of the present disclosure. For example, the voltage input to the electrode structure may be 30-80V.

As illustrated in FIG. 1 and FIG. 2A, the line width of the first comb tooth 111 and the line width of the second comb tooth 121 are both 3-7 microns, both the line width of the first comb tooth 111 and the line width of the second comb tooth 121 are not less than the distance between the first comb tooth 111 and the second comb tooth 121 that are adjacent, the ratio of the length of an overlapping portion of orthographic projections, on a plane, of the first comb tooth 111 and the second comb tooth 121 that are adjacent to the length of the first comb tooth 111 is 5%-50%, the ratio of the length of the first comb tooth 111 to the length of the second comb tooth 121 is 0.7-1.5, the width of the cantilever beam 122 is not less than the line width of the second comb tooth

121, and the thickness of the first comb tooth 111 and the thickness of the second comb tooth 121 are both 300 nanometers to 500 microns.

The above-mentioned plane is a plane parallel to the second direction and perpendicular to the first direction. The above-mentioned length of the overlapping portion of orthographic projections, on the plane, of the first comb tooth 111 and the second comb tooth 121 that are adjacent refers to the size of the overlapping portion of the orthographic projections in the second direction. The above-mentioned length of the first comb tooth 111 refers to the size of the first comb tooth 111 in the second direction. The thickness of the first comb tooth 111 and the thickness of the second comb tooth 121 refer to the size of a comb tooth in a direction perpendicular to the plane where the first direction and the second direction lie. The above-mentioned width of the cantilever beam 122 refers to the size of the cantilever beam 122 in the second direction. The above-mentioned line width of the first comb tooth 111 refers to the size of the first comb tooth 111 in the first direction, such as the line width W1 illustrated in FIG. 2B; and the above-mentioned line width of the second comb tooth 121 refers to the size of the second comb tooth 121 in the first direction, such as the line width W2 illustrated in FIG. 2B. As illustrated in FIG. 2B, the above-mentioned distance between the first comb tooth 111 and the second comb tooth 121 that are adjacent refers to the distance L between the edges of the first comb tooth 111 and the second comb tooth 121 that are close to each other.

The micro-electro-mechanical system provided by the present disclosure can balance the electrostatic driving force of the micro-electro-mechanical system and the stability of the second comb teeth by setting parameters such as the line width of the first comb tooth and the line width of the second comb tooth, the relationship between the distance between the first comb tooth and the second comb tooth and the line width of the second comb tooth, the relationship between the size of the overlapping portion of the first comb tooth and the second comb tooth and the length of the first comb tooth, the relationship between the width of the cantilever beam and the line width of the second comb tooth, the thickness of the first comb tooth and the thickness of the second comb tooth, etc.

For example, as illustrated in FIG. 1 and FIG. 2A, the line width of the first comb tooth 111 and the line width of the second comb tooth 121 are both greater than the distance between the first comb tooth 111 and second comb tooth 121 that are adjacent.

For example, as illustrated in FIG. 1 and FIG. 2A, the line width of the first comb tooth 111 and the line width of the second comb tooth 121 are both 3.5-6 microns. For example, the line width of the first comb tooth 111 and the line width of the second comb tooth 121 are both 4-6.5 microns. For example, the line width of the first comb tooth 111 and the line width of the second comb tooth 121 are both 5-5.5 microns. The setting of the line width of the first comb tooth and the line width of the second comb tooth satisfies the limit in the process, so that the comb teeth have a smaller line width while satisfying the process yield.

In some examples, as illustrated in FIG. 1 and FIG. 2A, the distance between the first comb tooth 111 and second comb tooth 121 that are adjacent is 2-4 microns. For example, the distance between the first comb tooth 111 and second comb tooth 121 that are adjacent is 2.8-3.5 microns. For example, the distance between the first comb tooth 111 and second comb tooth 121 that are adjacent is 2.5-3 microns. Setting the distance between the first comb tooth and the second comb tooth that are adjacent to be smaller than the line width of the first comb tooth and the line width of the second comb tooth, that is, setting the distance smaller, is beneficial to improve the electrostatic driving force between the first comb tooth and the second comb tooth.

For example, as illustrated in FIG. 1 and FIG. 2A, a ratio of a length of an overlapping portion of orthographic projections, on a straight line extending along the second direction, of the first comb tooth 111 and the second comb tooth 121 that are adjacent to the length of the first comb tooth 111 is 10%-25%. For example, the ratio of the length of the overlapping portion of orthographic projections, on a straight line extending along the second direction, of the first comb tooth 111 and the second comb tooth 121 that are adjacent to the length of the first comb tooth 111 is 15%-45%. For example, the ratio of the length of the overlapping portion of orthographic projections, on a straight line extending along the second direction, of the first comb tooth 111 and the second comb tooth 121 that are adjacent to the length of the first comb tooth 111 is 25%-40%. For example, the ratio of the length of the overlapping portion of orthographic projections, on a straight line extending along the second direction, of the first comb tooth 111 and the second comb tooth 121 that are adjacent to the length of the first comb tooth 111 is 20%-35%. The overlapping portion of orthographic projections, on a straight line extending along the second direction, of the first comb tooth and the second comb tooth that are adjacent may be regarded as a portion of the first comb tooth overlapping with the second comb tooth.

For example, as illustrated in FIG. 1 and FIG. 2A, the ratio of the length of the overlapping portion of orthographic projections, on a straight line extending along the second direction, of the first comb tooth 111 and the second comb tooth 121 that are adjacent to the length of the second comb tooth 121 is 5%-50%. For example, the ratio of the length of the overlapping portion of orthographic projections, on a straight line extending along the second direction, of the first comb tooth 111 and the second comb tooth 121 that are adjacent to the length of the second comb tooth 121 is 10%-25%.

For example, as illustrated in FIG. 1 and FIG. 2A, the total number of the first comb teeth 111 is 5-200, and the total number of the second comb teeth 121 is 5-200. For example, the total number of the first comb teeth 111 is 15-100, and the total number of the second comb teeth 121 is 15-100. For example, the total number of the first comb teeth 111 is 20-80, and the total number of the second comb teeth 121 is 20-80. For example, the total number of the first comb teeth 111 is 30-60, and the total number of the second comb teeth 121 is 30-60. For example, the total number of the first comb teeth 111 is 40-50, and the total number of the second comb teeth 121 is 40-50. For example, the ratio of the total number of the first comb teeth 111 to the total number of the second comb teeth 121 is 0.9-1.1.

In the micro-electro-mechanical system provided by the present disclosure, setting the total number of the first comb teeth and the total number of the second comb teeth, and setting the size of the overlapping portion of the first comb teeth and the second comb teeth, and the distance between the first comb tooth and the second comb tooth that are adjacent is beneficial to make the micro-electro-mechanical system have an appropriate electrostatic driving force to improve the stability of the micro-electro-mechanical system.

For example, as illustrated in FIG. 1 and FIG. 2A, the plurality of first comb teeth 111 are evenly distributed, and the plurality of second comb teeth 121 are evenly distributed.

For example, as illustrated in FIG. 1 and FIG. 2A, the ratio of the length of the first comb tooth 111 to the length of the second comb tooth 121 is 0.8-1.3. For example, the ratio of the length of the first comb tooth 111 to the length of the second comb tooth 121 is 0.9-1.1. For example, the length of the first comb tooth 111 may be identical to or different from the length of the second comb tooth 121. For example, the length of the first comb tooth 111 and the length of the second comb tooth 121 may both be 10-100 microns. For example, the length of the first comb tooth 111 and the length of the second comb tooth 121 may both be 20-90 microns. For example, the length of the first comb tooth 111 and the length of the second comb tooth 121 may both be 30-80 microns. For example, the length of the first comb tooth 111 and the length of the second comb tooth 121 may both be 50-60 microns.

For example, as illustrated in FIG. 1 and FIG. 2A, the thickness of the first comb tooth 111 and the thickness of the second comb tooth 121 are both 300 nanometers to 500 microns. For example, the thickness of the first comb tooth 111 and the thickness of the second comb tooth 121 are both 500 nanometers to 450 microns. For example, the thickness of the first comb tooth 111 and the thickness of the second comb tooth 121 are both 1 micron to 400 microns. For example, the thickness of the first comb tooth 111 and the thickness of the second comb tooth 121 are both 2 microns to 100 microns. For example, the thickness of the first comb tooth 111 and the thickness of the second comb tooth 121 are both 5 microns to 50 microns. For example, the thickness of the first comb tooth 111 and the thickness of the second comb tooth 121 are both 6 microns to 200 microns. For example, the thickness of the first comb tooth 111 and the thickness of the second comb tooth 121 are both 10 microns to 300 microns. For example, the thickness of the first comb tooth 111 and the thickness of the second comb tooth 121 are both 20 microns to 50 microns. For example, the thickness of the first comb tooth 111 and the thickness of the second comb tooth 121 are both 30 microns to 150 microns.

The micro-electro-mechanical system provided by the present disclosure, by setting the relationship between the length of the first comb tooth and the length of the second comb tooth, the proportion of the overlapping portion of the first comb tooth and the second comb tooth to the length of the first comb tooth, and the thickness of the first comb tooth and the thickness of the second comb tooth, takes into account the maximum displacement of the second comb tooth to adjust the electrostatic driving force between the first comb tooth and the second comb tooth and reduces the probability of the suspended second comb tooth collapsing to balance the electrostatic driving force of the micro-electro-mechanical system and the stability of the second comb teeth.

For example, as illustrated in FIG. 1 and FIG. 2A, the width of the cantilever beam 122 is greater than the line width of the second comb tooth 121. For example, the width of the cantilever beam 122 may be 10-50 microns. For example, the width of the cantilever beam 122 may be 20-30 microns.

For example, as illustrated in FIG. 1 and FIG. 2A, the cantilever beam 122 and the second comb teeth 121 may be an integral structure. For example, the cantilever beam 122 and the second comb teeth 121 are formed in a synchronous patterning process. The above-mentioned and subsequent "synchronous patterning" means that the two structures include a plurality of film layers, for example, a first structure includes a first film layer and a second film layer, a second structure includes a third film layer and a fourth film layer, the first film layer of the first structure and the third film layer of the second structure are formed in the same patterning process, and the second film layer of the first structure and the fourth film layer of the second structure are formed in the same patterning process.

In some examples, as illustrated in FIG. 1 and FIG. 2A, the cantilever beam 122 is provided with at least one first via 401, the maximum size of the orthographic projection of the first via 401 on a plane parallel to the first direction and the second direction is not less than 3 microns, and the distance between an edge of the first via 401 and any edge of the cantilever beam 122 is greater than 2 microns. For example, the maximum size of the orthographic projection of the first via 401 on a plane parallel to the first direction and the second direction is not less than 4 microns, and the distance between an edge of the first via 401 and any edge of the cantilever beam 122 is greater than 3 microns. The above-mentioned plane parallel to the first direction and the second direction may refer to a plane parallel to the X direction and the Y direction illustrated in FIG. 2A, such as a plane parallel to the paper.

For example, as illustrated in FIG. 1 and FIG. 2A, the first via 401 may be a circular hole, an oval hole, a square hole or a strip-shaped hole. The above-mentioned maximum size of the orthographic projection of the first via may refer to the diameter of a circular hole, the size of a major axis of an oval hole, the length of a diagonal line of a square hole, and the length of a long side or a long axis of a strip-shaped hole. For example, the distance between an edge of the first via 401 and an edge of the cantilever beam 122 close to the second comb tooth 121, the distance between an edge of the first via 401 and an edge of the cantilever beam 122 away from the second comb tooth 121, and the distance between an edge of the first via 401 and two edges of the cantilever beam 122 on both sides in the X direction are all greater than 3 microns. For example, the line width of a region of the cantilever beam 122 except for the first via 401 is at least 3 microns to maintain the stability of the cantilever beam, for example, preventing the cantilever beam from collapsing or deforming.

For example, as illustrated in FIG. 1 and FIG. 2A, the total number of the first via 401 is at least one. For example, the total number of the first vias 401 may be a plurality, for example, the plurality of first vias 401 may be arranged along the length direction of the cantilever beam 122, for example, the plurality of first vias 401 are arranged evenly, or arranged unevenly.

Providing the first via in the cantilever beam is beneficial to etch the sacrificial material layer (described later) in the cantilever beam so that the cantilever beam is formed into a suspended structure.

In some examples, as illustrated in FIG. 1 and FIG. 2A, the line width of the first electrode line 330 and the line width of the second electrode line 340 are both more than 10 times the width of the cantilever beam 122, and the maximum size of the first electrode 310 and the maximum size of the second electrode 320 are not less than 1000 microns. For example, neither the maximum size of the first electrode 310 nor the maximum size of the second electrode 320 is greater than 50 mm. For example, neither the maximum size of the first electrode 310 nor the maximum size of the second electrode 320 is greater than 8000 microns.

By setting the line width of the first electrode line, the line width of the second electrode line, the maximum size of the first electrode, and the maximum size of the second electrode, it is possible to prevent the first electrode line, the second electrode line, the first electrode and a sacrificial layer (described later) in the second electrode from being completely etched to form a suspended structure while the second comb tooth portion is formed into a suspended structure. For example, while a sacrificial material layer of the second comb tooth portion is etched with hydrofluoric acid so that the second comb tooth portion is formed into a suspended structure, sacrificial material layers in the first electrode line, the second electrode line, the first electrode, and the second electrode are all transversely etched away by hydrofluoric acid (HF).

For example, as illustrated in FIG. 1 and FIG. 2A, the line width of the first electrode line 330 and the line width of the second electrode line 340 are both more than 20 times the width of the cantilever beam 122. For example, the line width of the first electrode line 330 and the line width of the second electrode line 340 are both more than 30 times the width of the cantilever beam 122. For example, the line width of the first electrode line 330 and the line width of the second electrode line 340 are both more than 40 times the width of the cantilever beam 122. For example, the line width of the first electrode line 330 and the line width of the second electrode line 340 are both more than 50 times the width of the cantilever beam 122.

For example, as illustrated in FIG. 1 and FIG. 2A, the planar shapes of the first electrode 310 and the second electrode 320 may both be a square, and the side length of the square is not less than 1000 microns. For example, the planar shapes of the first electrode 310 and the second electrode 320 may both be a rectangle, and the long side of the rectangle is not less than 1000 microns. For example, the planar shapes of the first electrode 310 and the second electrode 320 may both be a circle, and the diameter of the circle is not less than 1000 microns.

By setting the planar sizes of the first electrode and the second electrode, while avoiding the first electrode and the second electrode from being formed into a suspended structure, it is possible to make the area of the first electrode or the second electrode satisfy the requirements for direct charging, for example, facilitating the charging of the first electrode and the second electrode by a probe.

In some examples, as illustrated in FIG. 1 and FIG. 2A, the first comb tooth portion 110 further includes a support portion 112 connected to the plurality of first comb teeth 111. The support portion is configured to support the first comb teeth.

In some examples, as illustrated in FIG. 1 and FIG. 2A, the ratio of the size of the support portion 112 in the second direction to the line width of the first comb tooth 111 is not less than 5. For example, the ratio of the size of the support portion 112 in the second direction to the line width of the first comb tooth 111 is not less than 7. For example, the ratio of the size of the support portion 112 in the second direction to the line width of the first comb tooth 111 is not less than 10. For example, the ratio of the size of the support portion 112 in the first direction to the line width of the first comb tooth 111 is not less than 5. For example, the ratio of the size of the support portion 112 in the first direction to the line width of the first comb tooth 111 is not less than 10. By setting the size of the support portion larger, it is possible to prevent all sacrificial material layers (described later) in the support portion from being etched away while forming the second comb tooth portion as a suspended structure by etching, so as to improve the stability of the support portion.

For example, as illustrated in FIG. 1 and FIG. 2A, the support portion 112 and the first comb teeth 111 may be an integral structure. For example, the support portion 112 and the first comb teeth 111 may be formed in a simultaneous patterning process. For example, the first electrode line 330 and the support portion 112 may be an integral structure.

For example, as illustrated in FIG. 1 and FIG. 2A, the second electrode 320 and the second electrode line 340 may be an integral structure. For example, the second electrode 320 and the second electrode line 340 may be formed in a simultaneous patterning process. For example, the first electrode 310 and the first electrode line 330 may be an integral structure. For example, the first electrode 310 and the first electrode line 330 may be formed in a simultaneous patterning process.

For example, as illustrated in FIG. 1 and FIG. 2A, the first comb tooth 111 is a suspended structure. For example, the film layers included in the first comb tooth 111 may be the same as the film layers included in the second comb tooth 121. For example, the first comb tooth 111 and the second comb tooth 121 may be formed in a simultaneous patterning process.

Figure 3:
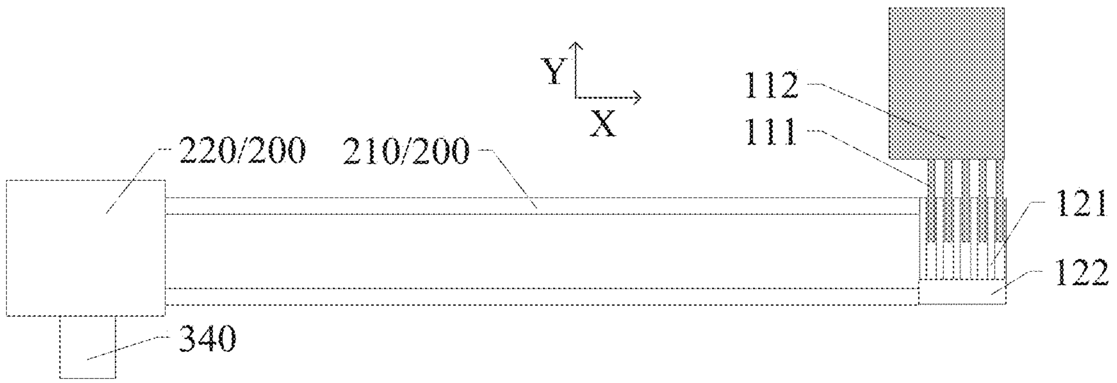
FIG. 3 is a partially enlarged view of a region B in an example of the micro-electro-mechanical system illustrated in FIG. 1.

FIG. 3 is a partially enlarged view of a region B in an example of the micro-electro-mechanical system illustrated in FIG. 1.

In some examples, as illustrated in FIG. 1 to FIG. 3, the spring structure 200 includes a spring body 210 on either side of the cantilever beam 122 in the first direction, the spring body 210 is connected to the cantilever beam 122, and the spring body 210 is a suspended structure. For example, the spring body 210 and the cantilever beam 122 may be an integral structure. For example, the spring body 210 and the cantilever beam 122 may be formed in a simultaneous patterning process. The spring structure is configured to support the second comb tooth portion.

In some examples, as illustrated in FIG. 1 to FIG. 3, the spring body 210 extends along the first direction, and the line width of the spring body 210 is 3-5 microns. For example, the shape of the spring body 210 may be linear. For example, the line width of the spring body 210 may be 3.5-4 microns. For example, the line width of the spring body 210 may be 3.7-4.5 microns. The smaller the line width of the spring body, the larger the movable range of the spring body, but the weaker the stiffness of the spring body, the greater the risk of breakage. The micro-electro-mechanical system provided by the present disclosure, by setting the line width of the spring body to 3-5 microns, can ensure that the second comb teeth have a large movable range while preventing the spring body from breaking.

In some examples, as illustrated in FIG. 1 to FIG. 3, the ratio of the length of the spring body 210 on the same side of the cantilever beam 122 to the length of the cantilever beam 122 is 0.5-3. For example, the ratio of the length of the spring body 210 on the same side of the cantilever beam 122 to the length of the cantilever beam 122 is 0.8-2.5. For example, the ratio of the length of the spring body 210 on the same side of the cantilever beam 122 to the length of the cantilever beam 122 is 1-1.5. The longer the length of the spring body, the larger the movable range of the spring body, but the weaker the stiffness of the spring body, the greater the risk of the spring body collapsing.

In some examples, as illustrated in FIG. 1 to FIG. 3, the total number of the spring body 210 on the same side of the cantilever beam 122 is 1-6. For example, the total number of the spring body 210 on the same side of the cantilever beam 122 is 2-3. For example, the total number of the spring body 210 on the same side of the cantilever beam 122 is 4-5. For example, in the case where the total number of the spring body 210 on the same side of the cantilever beam 122 is greater than two, the spring bodies 210 are arranged in equal intervals. The greater the total number of the spring body, the greater the stability of the cantilever beam, but the smaller the movable range of the spring body.

For example, as illustrated in FIG. 1 to FIG. 3, the spring bodies 210 on both sides of the cantilever beam 122 are symmetrically distributed, for example, the total number, length and line width of the spring bodies 210 on both sides of the cantilever beam 122 are the same.

The micro-electro-mechanical system provided by the present disclosure, by setting the line width of the spring body, the relationship between the length of the spring body and the length of the cantilever beam, and the total number of the spring body, can enable the second comb tooth to have a larger movable range, as well as enable the cantilever beam to be more stable and have a lower risk of fracture of the spring body, which is beneficial to improving the yield and stability of the micro-electro-mechanical system.

In some examples, as illustrated in FIG. 1 to FIG. 3, the spring structure 200 is a conductive structure, the spring structure 200 further includes a fixing portion 220 connected to an end of the spring body 210 away from the cantilever beam 122, and two ends of the second electrode line 340 are electrically connected to the second electrode 320 and the fixing portion 220, respectively. For example, the driving voltage applied by the second electrode 320 is applied to the second comb tooth portion 120 through the second electrode line 340, the fixing portion 220 and the spring body 210. For example, the spring structure 200 includes two fixing portions 220. For example, the two fixing portions 220 are distributed symmetrically with respect to the second comb tooth portion 120.

In some examples, as illustrated in FIG. 1 to FIG. 3, the ratio of the size of the fixing portion 220 in the first direction to the line width of the second electrode line 340 is not less than 2. For example, the ratio of the size of the fixing portion 220 in the first direction to the line width of the second electrode line 340 is not less than 2.5. For example, the ratio of the size of the fixing portion 220 in the first direction to the line width of the second electrode line 340 is not less than 3. For example, the ratio of the maximum size of the fixing portion 220 to the line width of the second electrode line 340 is not less than 3. For example, the shape of the fixing portion 220 may be a square, and the size of the fixing portion 220 in the first direction may be the side length of the square. For example, the shape of the fixing portion 220 may also be a rectangle, a circle, an ellipse, etc., which are not limited in the embodiments of the present disclosure.

The micro-electromechanical system provided by the present disclosure, by setting the size of the fixing portion larger, can prevent all sacrificial material layers (described later) in the fixing portion from being etched away while forming the spring body as a suspended structure by etching, so as to improve the stability of the fixing portion.

For example, as illustrated in FIG. 1 to FIG. 3, the second electrode line 340 and the fixing portion 220 may be an integral structure.

For example, as illustrated in FIG. 1 to FIG. 3, the line width of the first comb tooth 111 and the line width of the second comb tooth 121 are both 5 microns, the distance between the first comb tooth 111 and the second comb tooth 121 that are adjacent is 5 microns, the total number of the first comb teeth 111 is 50, the total number of the second comb teeth 121 is 50, the line width of the spring body 210 is 3 microns, and the length of the spring body 210 on the same side of the cantilever beam 122 may be 1000 microns. The maximum amount of deformation of the second comb tooth 121, such as the maximum amount of deformation in a direction perpendicular to a bottom layer (the bottom layer 610 illustrated in FIG. 9) and deformed to a side close to the bottom layer, is 0.0285 microns, and the above-mentioned “deformation” and the “deformation” described later may refer to an end of the second comb tooth away from the cantilever beam being closer to the bottom layer than an end of the second comb tooth close to the cantilever beam. The maximum amount of deformation is smaller than the size of the remaining space in the above-mentioned direction after the sacrificial material layer is etched away in the second comb tooth 121, so the second comb tooth 121 will not collapse. When a driving voltage of 30V is applied to the comb tooth structure, the second comb tooth moves relative to the first comb tooth at a distance of 0.64 microns.

For example, as illustrated in FIG. 1 to FIG. 3, the line width of the first comb tooth 111 and the line width of the second comb tooth 121 are both 6 microns, the distance between the first comb tooth 111 and the second comb tooth 121 that are adjacent is 3 microns, the total number of the first comb teeth 111 is 50, the total number of the second comb teeth 121 is 50, the line width of the spring body 210 is 3 microns, and the length of the spring body 210 on the same side of the cantilever beam 122 may be 900 microns. The maximum amount of deformation of the second comb tooth 121, such as the maximum amount of deformation in a direction perpendicular to a bottom layer (the bottom layer 610 illustrated in FIG. 9) and deformed to a side close to the bottom layer, is 0.016 microns, and the maximum amount of deformation is smaller than the size of the remaining space in the above-mentioned direction after the sacrificial material layer is etched away in the second comb tooth 121, so the second comb tooth 121 will not collapse. When a driving voltage of 30V is applied to the comb tooth structure, the second comb tooth moves relative to the first comb tooth at a distance of 3.63 microns.

For example, as illustrated in FIG. 1 and FIG. 2A, the ratio of the line width of the first comb tooth 111 to the line width of the second comb tooth 121 is 0.7-1.5. For example, the line width of the first comb tooth 111 is identical to the line width of the second comb tooth 121.

For example, as illustrated in FIG. 1 and FIG. 2A, each first comb tooth 111 is in a structure with line widths provided evenly, and each second comb tooth 121 is in a structure with line widths provided evenly.

Figure 4:
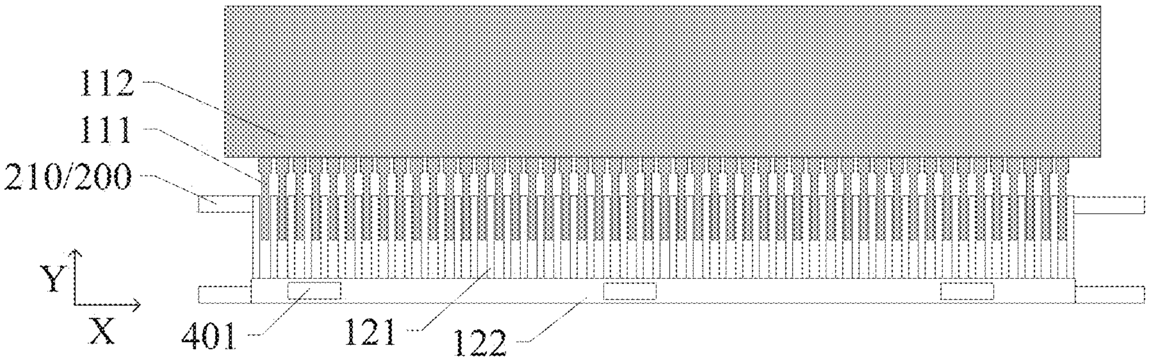
FIG. 4 is a partially enlarged view of a region A in another example of the micro-electro-mechanical system illustrated in FIG. 1.

FIG. 4 is a partially enlarged view of a region A in another example of the micro-electro-mechanical system illustrated in FIG. 1. The difference between the micro-electro-mechanical system illustrated in FIG. 4 and the micro-electro-mechanical system illustrated in FIG. 2A is that the line width of at least a partial position of at least one first comb tooth 111 is greater than the line width of at least one second comb tooth 121, and/or the thickness of at least a partial position of at least one first comb tooth 111 is greater than the thickness of at least one second comb tooth 121.

The spring structure 200, the electrode structure 300, the second comb tooth portion 120, and the support portion 112 in the micro-electro-mechanical system illustrated in FIG. 4 may have the same features as the spring structure 200, the electrode structure 300, the second comb tooth portion 120, and the support portion 112 in the micro-electro-mechanical system illustrated in FIG. 2A, which will not be repeated herein.

The micro-electro-mechanical system provided in the present example, by setting the line width and/or thickness of the first comb tooth to be larger than the line width and/or thickness of the second comb tooth, is beneficial to improving the stability of the first comb teeth as fixed teeth. If the line width of the first comb tooth is set larger, at least part of the sacrificial layer may remain in the first comb teeth to improve the stability of the first comb teeth.

For example, the first comb tooth 111 may be a suspended structure.

For example, as illustrated in FIG. 4, the line width at some positions of each first comb tooth 111 is greater than the line width of each second comb tooth 121. For example, the first comb tooth 111 is in a structure with line widths provided unevenly, and the second comb tooth 121 is in a structure with line widths provided evenly. For example, line widths at some positions of the first comb tooth 111 away from the second comb tooth 121 are greater than the line width of the second comb tooth 121, and line widths of some other positions of the first comb tooth 111 close to the second comb tooth 121 are identical to the line width of the second comb tooth 121. For example, the length of the above-mentioned some positions of the first comb tooth 111 is 1%-30% of the total length of the first comb tooth 111. For example, the length of the above-mentioned some positions of the first comb tooth 111 is less than 25% of the total length of the first comb tooth 111. For example, the length of the above-mentioned some positions of the first comb tooth 111 is less than 20% of the total length of the first comb tooth 111. For example, the length of the above-mentioned some positions of the first comb tooth 111 is 3%-15% of the total length of the first comb tooth 111. For example, the length of the above-mentioned some positions of the first comb tooth 111 is 5%-10% of the total length of the first comb tooth 111.

The embodiments of the present disclosure are not limited to the above-mentioned case, for example, both the first comb tooth and the second comb tooth are respectively in a structure with line widths provided evenly, and the line width of the first comb tooth is greater than the line width of the second comb tooth.

For example, the sacrificial material layer in the first comb tooth 111 may be fully or partially retained, so that the thickness of the first comb tooth 111 is greater than the thickness of the second comb tooth 121, and in this case, the first comb tooth 111 is not a suspended structure. The above-mentioned first comb tooth may include a functional layer and a sacrificial layer, and the second comb tooth does not include a sacrificial layer. The above-mentioned "the thickness of the first comb tooth being greater than the thickness of the second comb tooth" means that the total thickness of respective film layers in the first comb tooth is greater than the total thickness of respective film layers in the second comb tooth. For example, the thickness difference between the first comb tooth and the second comb tooth may be the thickness of the sacrificial layer.

Figure 5:
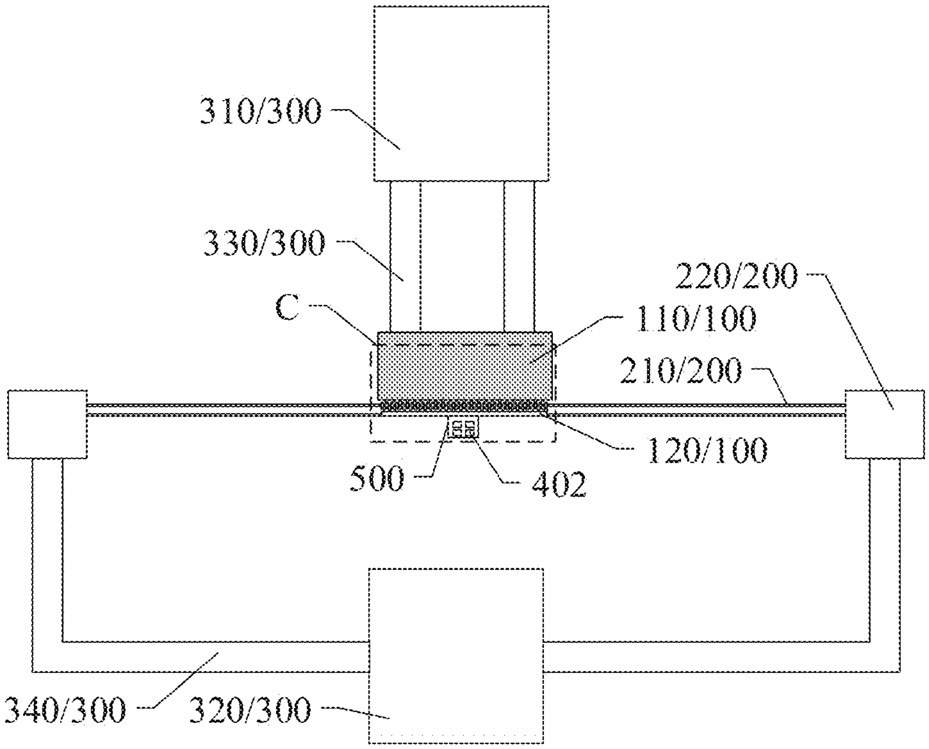
FIG. 5 is a schematic structural view of a micro-electro-mechanical system provided according to another example of the embodiments of the present disclosure.
Figure 6:
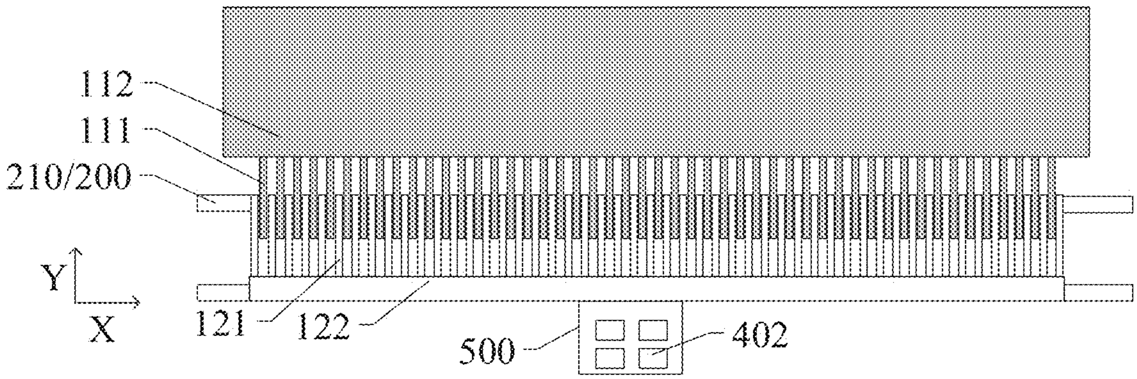
FIG. 6 is a partially enlarged view of a region C in the micro-electro-mechanical system illustrated in FIG. 5.

FIG. 5 is a schematic structural view of a micro-electro-mechanical system provided according to another example of the embodiments of the present disclosure, and FIG. 6 is a partially enlarged view of a region C in the micro-electro-mechanical system illustrated in FIG. 5. The difference between the micro-electro-mechanical system illustrated in FIG. 5 and the micro-electro-mechanical system illustrated in FIG. 1 is that the micro-electro-mechanical system illustrated in FIG. 5 further includes a baffle 500. The comb tooth structure 100, the spring structure 200, and the electrode structure 300 in the micro-electro-mechanical system illustrated in FIG. 5 may have the same features as the comb tooth structure 100, the spring structure 200, and the electrode structure 300 in the micro-electro-mechanical system illustrated in FIG. 1, which will not be repeated herein. FIG. 5 schematically illustrates that the comb tooth structure 100 is the comb tooth structure 100 illustrated in FIG. 2A, but the embodiment is not limited thereto. The comb tooth structure 100 in the present example may also be the comb tooth structure illustrated in FIG. 4.

In some examples, as illustrated in FIG. 5 and FIG. 6, a baffle 500 is provided on a side of the cantilever beam 122 away from the plurality of second comb teeth 121, the baffle 500 is a suspended structure, the baffle 500 is provided with at least one second via 402, and the maximum size of the orthographic projection of the second via 402 on a plane parallel to the first direction and the second direction is not less than 3 microns. The above-mentioned plane parallel to the first direction and the second direction may refer to a plane parallel to the X direction and the Y direction illustrated in FIG. 6, such as a plane parallel to the paper.

For example, the maximum size of the orthographic projection of the second via 402 on the above-mentioned plane is not less than 4 microns. For example, the maximum size of the orthographic projection of the second via 402 on the above-mentioned plane is not less than 4.5 microns. For example, the maximum size of the orthographic projection of the second via 402 on the above-mentioned plane is not less than 5 microns. For example, the maximum size of the orthographic projection of the second via 402 on the above-mentioned plane is not less than 5.5 microns.

For example, as illustrated in FIG. 5 and FIG. 6, the second via 402 may be a circular hole, an oval hole, a square hole or a strip-shaped hole. The above-mentioned maximum size of the orthographic projection of the second via 402 may refer to the diameter of a circular hole, the size of a major axis of an oval hole, the length of a diagonal line of a square hole, and the length of a long side or a long axis of a strip-shaped hole.

Providing the second via in the baffle is beneficial to etching a sacrificial material layer in the baffle so that the baffle is formed into a suspended structure.

For example, as illustrated in FIG. 5 and FIG. 6, a plurality of second vias 402 are provided in the baffle 500, and the plurality of second vias 402 are provided evenly.

For example, as illustrated in FIG. 5 and FIG. 6, the shape of the orthographic projection of the baffle 500 on a plane parallel to the first direction and the second direction may be a polygon, a circle, or an ellipse. The embodiments of the present disclosure do not limit the specific shape of the baffle, which may be set according to application scenarios.

For example, as illustrated in FIG. 5 and FIG. 6, the baffle 500 and the cantilever beam 122 may be an integral structure. For example, the baffle 500 and the cantilever beam 122 may be formed in a simultaneous patterning process. For example, the second comb tooth portion 120 is configured to drive the baffle 500 to move.

Figure 7A:
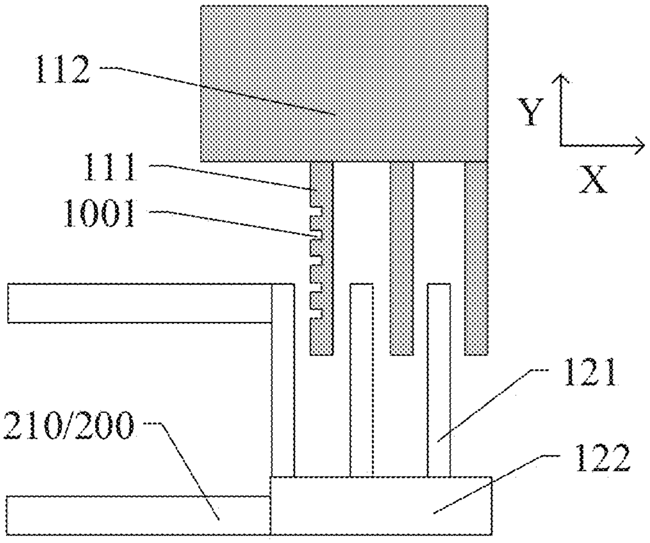
FIG. 7A and FIG. 7B are partially enlarged views of a comb tooth structure and a spring structure provided according to another example of the present disclosure.
Figure 7B:
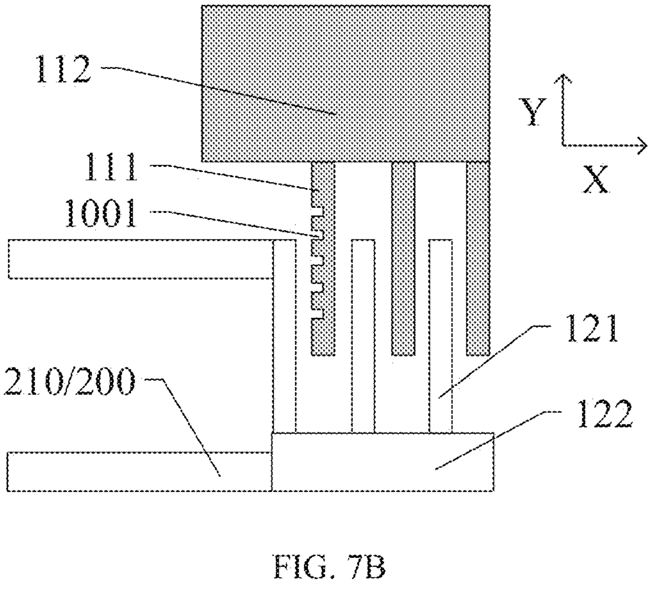

FIG. 7A and FIG. 7B are partially enlarged views of a comb tooth structure and a spring structure provided according to another example of the present disclosure. The difference between the micro-electro-mechanical system illustrated in FIG. 7A and FIG. 7B and the micro-electro-mechanical system illustrated in the above-mentioned example is that in the micro-electro-mechanical system illustrated in FIG. 7A and FIG. 7B, a plurality of notches 1001 are provided on at least one side edge, extending along the second direction, of at least one of at least one kind of the plurality of first comb teeth 111 and the plurality of second comb teeth 121, and the plurality of notches 1001 are provided evenly.

The spring structure 200 and the electrode structure 300 in the micro-electro-mechanical system illustrated in FIG. 7A and FIG. 7B may have the same features as the spring structure 200 and the electrode structure 300 in the micro-electro-mechanical system illustrated in FIG. 1, which will not be repeated herein. FIG. 7A and FIG. 7B schematically illustrate that the first comb tooth 111 and the second comb tooth 121 in the comb tooth structure 100 may be a structure with line widths provided evenly, or a structure with line widths provided unevenly as illustrated in FIG. 4. The micro-electro-mechanical system illustrated in FIG. 7A and FIG. 7B may include the baffle in the micro-electro-mechanical system illustrated in FIG. 5.

The comb tooth structure illustrated in FIG. 7A is the comb tooth structure when no power is applied, and the comb tooth structure illustrated in FIG. 7B is the comb tooth structure after power is applied. FIG. 7A and FIG. 7B are partially enlarged views of the comb tooth structure, or observation effect views of the comb tooth structure under a microscope.

For example, as illustrated in FIG. 7A and FIG. 7B, a plurality of notches 1001 are provided on an edge of the first comb tooth 111. After the comb tooth structure is powered, the second comb tooth 121 moves in a direction close to the first comb tooth 111 (the direction indicated by the arrow of the Y direction in the figure), and the moving distance can be measured by the notches 1001. The setting of the notches 1001 can facilitate the observation of the moving position of the second comb teeth and the acquisition of the moving distance.

For example, FIG. 7A and FIG. 7B schematically illustrate that one first comb tooth 111 at an edge is provided with a plurality of notches 1001, but the embodiments are not limited thereto, at least two first comb teeth 111 may be provided with the same number of notches 1001, or one second comb tooth 121 at an edge may be provided with a plurality of notches 1001, or at least two second comb teeth 121 may be provided with the same number of notches 1001.

For example, as illustrated in FIG. 7A and FIG. 7B, the ratio of the size of the notch 1001 in the Y direction to the distance between adjacent notches 1001 may be 1. For example, the size of the notch 1001 in the Y direction may be 1 micron, and the distance between adjacent notches 1001 may be 1 micron. For example, the size of the notch 1001 in the Y direction is not less than 1 micron. For example, the size of the notch 1001 in the Y direction is not less than 2 microns.

Figure 8:
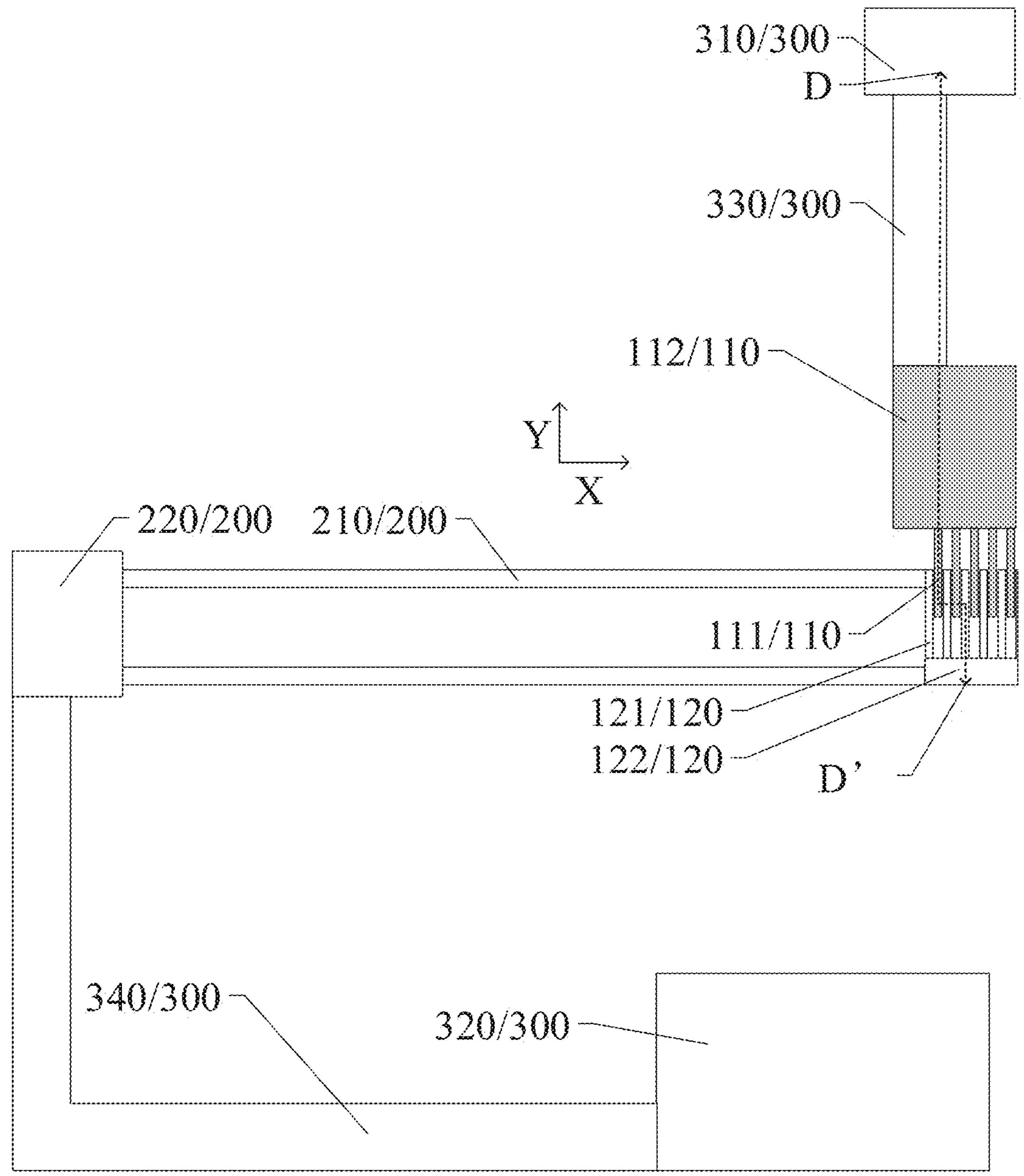
FIG. 8 is a partially enlarged view of the micro-electro-mechanical system illustrated in FIG. 1.

FIG. 8 is a partially enlarged view of the micro-electro-mechanical system illustrated in FIG. 1, and FIG. 9 to FIG. 12 are schematic views of partial cross-sectional structures taken along a line DD' illustrated in FIG. 8 in different examples.

Figure 9:
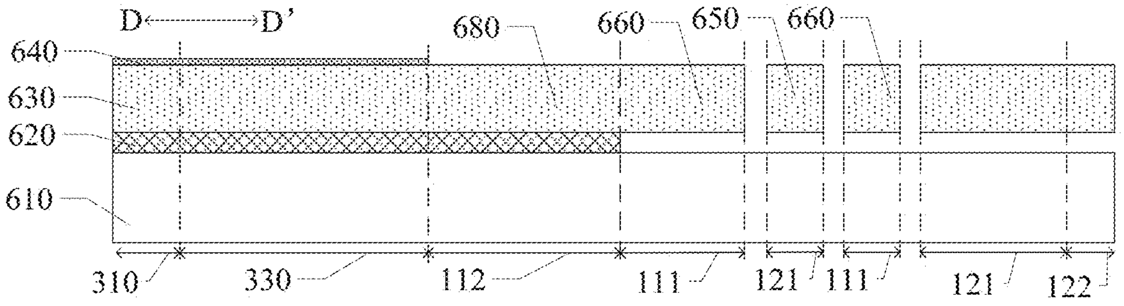
FIG. 9 to FIG. 12 are schematic views of partial cross-sectional structures taken along a line DD' illustrated in FIG. 8 in different examples.

In some examples, as illustrated in FIG. 1, FIG. 8 and FIG. 9, the electrode structure 300 includes a metal layer 640, a first functional layer 630, and a sacrificial layer 620 stacked sequentially, the second comb tooth portion 120 includes a second functional layer 650, the first functional layer 630 and the second functional layer 650 are provided in the same layer and made of the same material, and resistivities of both the first functional layer 630 and the second functional layer 650 are not greater than 0.015 ohm·cm.

The above-mentioned "same layer" and the "same layer" described later may refer to a layer structure formed by using the same film-forming process to form a film layer for forming a specific pattern, and then formed by using the same mask through one patterning process. That is, one patterning process corresponds to one mask. According to different specific patterns, one patterning process may include multiple exposure, development or etching processes, and the specific patterns in the formed layer structure may be continuous or discontinuous, and these specific patterns may be at the same height or have the same thickness, or may be at different heights or have different thicknesses.

For example, as illustrated in FIG. 1, FIG. 8 and FIG. 9, a bottom layer 610 is provided on a side of the sacrificial layer 620 away from the first functional layer 630. For example, the material of the bottom layer 610 may include silicon.

For example, as illustrated in FIG. 1, FIG. 8 and FIG. 9, the second comb tooth portion 120 is not provided with a sacrificial layer 620 to form a suspended structure. For example, the second functional layer 650 of the second comb tooth 121 and the second functional layer 650 of the cantilever beam 122 may be an integral structure.

For example, as illustrated in FIG. 1, FIG. 8 and FIG. 9, the first functional layer 630 of the first electrode 310 and the first functional layer 630 of the first electrode line 330 may be an integral structure, the sacrificial layer 620 of the first electrode 310 and the sacrificial layer 620 of the first electrode line 330 may be an integral structure, and the first functional layer 630 of the first electrode line 330, the functional layer 680 of the support portion 112 of the first comb tooth portion 110 and the functional layer 660 of the first comb tooth 111 of the first comb tooth portion 110 may be made of the same material, for example, may be formed to be an integral structure.

For example, as illustrated in FIG. 9, the first comb tooth 111 is not provided with the sacrificial layer 620 to form a suspended structure, and the support portion 112 connected to the first comb tooth 111 is provided with the sacrificial layer 620 to support the first comb tooth 111. For example, the support portion 112 is not provided with the metal layer 640.

For example, in the micro-electro-mechanical system illustrated in FIG. 1 and FIG. 9, the second electrode 320 and the second electrode line 340 may have the same structure as the first electrode 310, the spring body 210 may have the same structure as the cantilever beam 122, and the fixing portion 220 of the spring structure 200 may have the same structure as the support portion 112, which will not be repeated in the embodiments of the present disclosure. For example, the baffle illustrated in FIG. 5 may have the same structure as the cantilever beam 122 illustrated in FIG. 9 to FIG. 12, which will not be repeated herein.

As mentioned above, the electrode structure, the support portion in the first comb tooth portion, and the fixing portion in the spring structure are all provided with a sacrificial layer to improve stability, and the first comb tooth, the second comb tooth portion, the spring body and the baffle are not provided with a sacrificial layer to form a suspended structure.

For example, as illustrated in FIG. 9, the material of the metal layer 640 may include molybdenum, molybdenum/aluminum/molybdenum, molybdenum/copper/molybdenum, etc. For example, the materials of the first functional layer 630, the second functional layer 650, the functional layer 660 and the functional layer 680 may all be silicon, such as low-resistance silicon.

For example, as illustrated in FIG. 9, the material of the sacrificial layer 620 may be silicon dioxide. For example, the thickness of the sacrificial layer 620 may be 1-30 microns. For example, the thickness of the sacrificial layer 620 may be 2-6 microns. For example, the thickness of the sacrificial layer 620 may be 5-25 microns. For example, the thickness of the sacrificial layer 620 may be 10-20 microns.

For example, as illustrated in FIG. 9, the resistivities of both the first functional layer 630 and the second functional layer 650 are not greater than 0.01 ohm·cm. For example, the resistivities of both the first functional layer 630 and the second functional layer 650 are not greater than 0.008 ohm·cm. For example, the resistivities of both the first functional layer 630 and the second functional layer 650 are not greater than 0.005 ohm·cm.

For example, at least part of the sacrificial layer 620 may be retained in the first comb tooth 111 illustrated in FIG. 9 to improve the stability of the first comb tooth 111, and in this case, the thickness of at least a partial position of the first comb tooth 111 is greater than the thickness of the second comb tooth 121.

Figure 10:
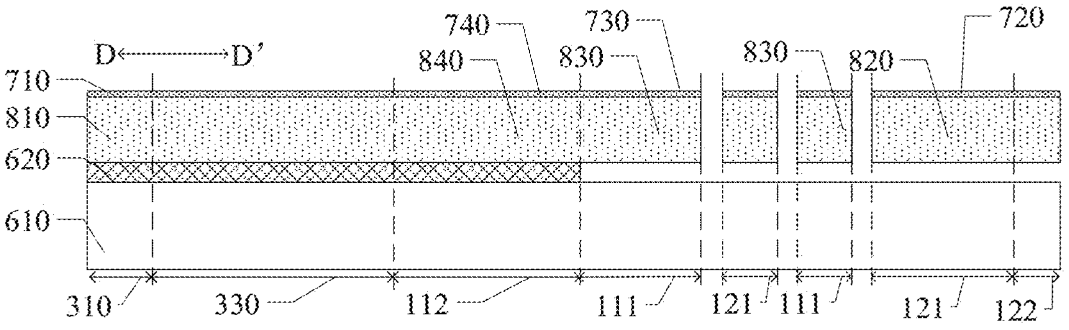

In some examples, as illustrated in FIG. 1, FIG. 8 and FIG. 10, the electrode structure 300 includes a first metal layer 710, a first functional layer 810, and a sacrificial layer 620 stacked sequentially, the second comb tooth portion 120 includes a second metal layer 720 and a second functional layer 820 stacked with each other, the first metal layer 710 and the second metal layer 720 are provided in the same layer and made of the same material, and the first functional layer 810 and the second functional layer 820 are provided in the same layer and made of the same material. For example, the resistivities of the first functional layer 810 and the second functional layer 820 are both 1-10 ohm·cm.

The difference between the micro-electro-mechanical system illustrated in FIG. 10 and the micro-electro-mechanical system illustrated in FIG. 9 is that both the first comb tooth portion and the second comb tooth portion in the micro-electro-mechanical system illustrated in FIG. 10 include a metal layer in contact with the functional layer. For example, the difference between the micro-electro-mechanical system illustrated in FIG. 10 and the micro-electro-mechanical system illustrated in FIG. 9 may further include that the resistivity of the functional layer is different from the resistivity of the functional layer in the micro-electro-mechanical system illustrated in FIG. 9.

As illustrated in FIG. 10, the resistivities of the first functional layer 810 and the second functional layer 820 are both 2-9 ohm·cm. For example, as illustrated in FIG. 10, the resistivities of the first functional layer 810 and the second functional layer 820 are both 3-7 ohm·cm. For example, as illustrated in FIG. 10, the resistivities of the first functional layer 810 and the second functional layer 820 are both 4-8 ohm·cm. For example, as illustrated in FIG. 10, the resistivities of the first functional layer 810 and the second functional layer 820 are both 5-6 ohm·cm. For example, as illustrated in FIG. 10, the resistivities of the first functional layer 810 and the second functional layer 820 are both 2-9 ohm·cm. For example, as illustrated in FIG. 10, the materials of the first functional layer 810 and the second functional layer 820 may both be high-resistance silicon.

The bottom layer 610 and the sacrificial layer 620 in the micro-electro-mechanical system illustrated in FIG. 10 may have the same features, such as the material, thickness, and position, as the bottom layer 610 and the sacrificial layer 620 illustrated in FIG. 9, which will not be repeated herein.

For example, as illustrated in FIG. 1, FIG. 8 and FIG. 10, the first functional layer 810 of the first electrode 310 and the first functional layer 810 of the first electrode line 330 may be an integral structure, and the first functional layer 810 of the first electrode line 330, the functional layer 840 of the support portion 112 of the first comb tooth portion 110 and the functional layer 830 of the first comb tooth 111 of the first comb tooth portion 110 may be made of the same material, for example, may be an integral structure. For example, the second functional layer 820 of the cantilever beam 122 and the second functional layer 820 of the second comb tooth 121 may be an integral structure. For example, the second metal layer 720 of the cantilever beam 122 and the second metal layer 720 of the second comb tooth 121 may be an integral structure.

For example, as illustrated in FIG. 10, the first metal layer 710 of the first electrode 310 and the first metal layer 710 of the first electrode line 330 may be an integral structure. For example, the first comb tooth 111 of the first comb tooth portion includes the functional layer 830 and the metal layer 730 stacked with each other, and the support portion 112 of the first comb tooth portion includes the sacrificial layer 620, the functional layer 840 and the metal layer 740 stacked sequentially. For example, the first metal layer 710 of the first electrode line 330, the metal layer 730 of the first comb tooth 111 and the metal layer 740 of the support portion 112 may be made of the same material, for example, may be an integral structure.

For example, in the micro-electro-mechanical system illustrated in FIG. 1 and FIG. 10, the second electrode 320 and the second electrode line 340 may have the same structure as the first electrode 310, the spring body 210 may have the same structure as the cantilever beam 122, and the fixing portion 220 of the spring structure 200 may have the same structure as the support portion 112, which will not be repeated in the embodiments of the present disclosure.

Figure 11:
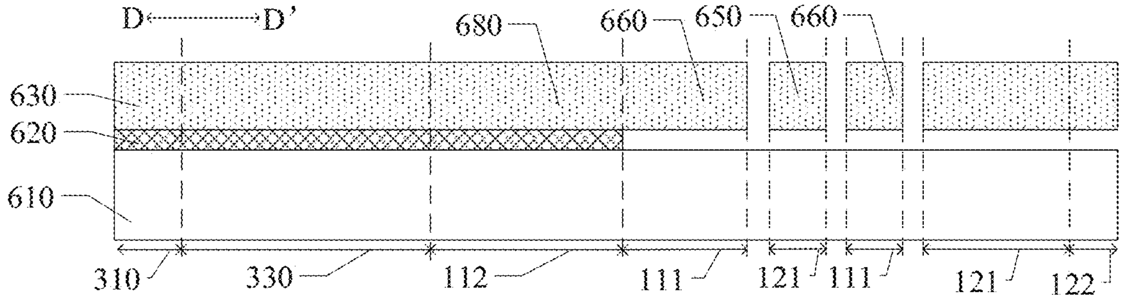

The difference between the micro-electro-mechanical system illustrated in FIG. 11 and the micro-electro-mechanical system illustrated in FIG. 9 is that the electrode structure in the micro-electro-mechanical system illustrated in FIG. 11 is not provided with a metal layer. The bottom layer 610 and the sacrificial layer 620 in the micro-electro-mechanical system illustrated in FIG. 11 may have the same features, such as the material, thickness, and position, as the bottom layer 610 and the sacrificial layer 620 illustrated in FIG. 9, which will not be repeated herein.

In some examples, as illustrated in FIG. 1, FIG. 8 and FIG. 11, the electrode structure 300 includes the first functional layer 630 and the sacrificial layer 620 stacked sequentially, the second comb tooth portion 120 includes the second functional layer 650, the first functional layer 630 and the second functional layer 650 are provided in the same layer and made of the same material, and the resistivities of the first functional layer 630 and the second functional layer 650 are both not greater than 0.015 ohm·cm.

The functional layers of the structures illustrated in FIG. 11 have the same features as the functional layers of the structures illustrated in FIG. 9, which will not be repeated herein.

Figure 12:
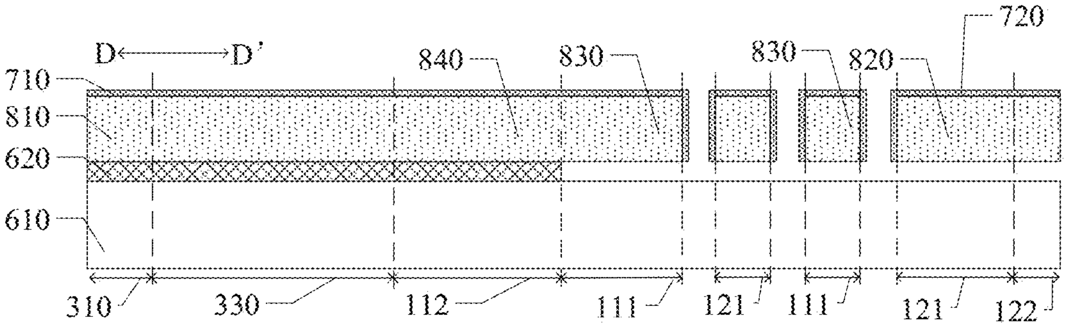

The difference between the micro-electro-mechanical system illustrated in FIG. 12 and the micro-electro-mechanical system illustrated in FIG. 10 is that the metal layer in the micro-electro-mechanical system illustrated in FIG. 12 is not only on the side surface of the functional layer away from the bottom layer, but the metal layer further includes a portion on the side surface of the functional layer. The bottom layer 610 and the sacrificial layer 620 in the micro-electro-mechanical system illustrated in FIG. 12 may have the same features, such as the material, thickness, and position, as the bottom layer 610 and the sacrificial layer 620 illustrated in FIG. 9, which will not be repeated herein.

In some examples, as illustrated in FIG. 1, FIG. 8 and FIG. 12, the electrode structure 300 includes the first functional layer 810 and the sacrificial layer 620 stacked with each other, and the first metal layer 710 is provided on a side surface of the first functional layer 810 away from the sacrificial layer 620 and on at least part of a side surface of the first functional layer 810; the second comb tooth portion 120 includes the second functional layer 820 and the second metal layer 720 stacked with each other, and the second metal layer 720 is provided on at least part of a side surface of the second functional layer 820; and the first functional layer 810 and the second functional layer 820 are provided in the same layer and made of the same material, and the first metal layer 710 and the second metal layer 720 are made of the same material.

For example, the functional layers of each structure in the present example may have the same features as the functional layers of the corresponding structure illustrated in FIG. 10, or may have the same features as the functional layers of each structure illustrated in FIG. 9, which will not be repeated herein.

For example, as illustrated in FIG. 12, the first comb tooth 111 includes the first functional layer 810 and the first metal layer 710 stacked with other, and the first metal layer 710 is provided on at least part of a side surface of the first functional layer 810 of the first comb tooth 111.

For example, as illustrated in FIG. 12, the first metal layer 710 and the second metal layer 720 may be made of copper or molybdenum to prevent the metal layer from being etched when the sacrificial layer is etched.

Figure 13:
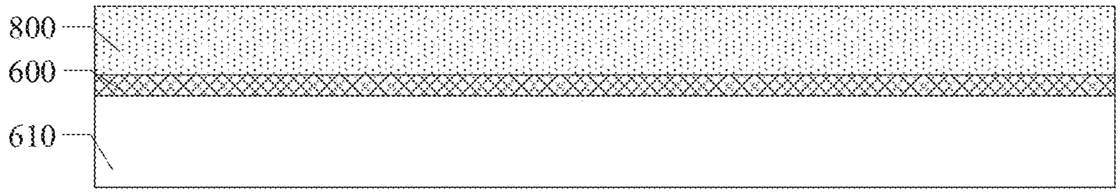
FIG. 13 is a schematic view of a substrate provided according to the embodiments of the present disclosure.

Another embodiment of the present disclosure provides a manufacturing method for manufacturing a micro-electro-mechanical system, and FIG. 13 illustrates a substrate provided according to the embodiments of the present disclosure.

As illustrated in FIG. 1 and FIG. 13, the manufacturing method of the micro-electro-mechanical system includes providing a substrate, and the substrate includes a bottom layer 610, a sacrificial material layer 600, and a functional material layer 800 stacked sequentially. The manufacturing method further includes patterning the substrate to form a comb tooth structure 100, a spring structure 200, and an electrode structure 300. For example, other film layers are formed on the substrate after the substrate being cleaned.

For example, as illustrated in FIG. 13, the substrate may be a silicon substrate, the materials of the bottom layer 610 and the functional material layer 800 both include silicon, and the material of the sacrificial material layer 600 includes silicon oxide.

FIG. 14A to FIG. 14E are flowcharts of a manufacturing process for forming a comb tooth structure, a spring structure, and an electrode structure provided according to an example of the embodiments of the present disclosure. The micro-electro-mechanical system formed by the flowcharts is the micro-electro-mechanical system illustrated in FIG. 9.

In some examples, as illustrated in FIG. 1, FIG. 9, and FIG. 14A to FIG. 14E, the manufacturing method of patterning the substrate to form the comb tooth structure, the spring structure and the electrode structure includes: forming a metal material layer 700 on a side of the functional material layer 800 away from the sacrificial material layer 600, for example, sputtering or depositing a metal material on the functional material layer 800.

In some examples, as illustrated in FIG. 1, FIG. 9, and FIG. 14A to FIG. 14E, the manufacturing method further includes patterning the metal material layer 700 to form the metal layer 640 of the electrode structure 300. For example, a first mask layer 910 is formed on the metal material layer 700, and the metal material layer 700 is patterned using the first mask layer 910 as a mask to form the metal layer 640. For example, forming the first mask layer 910 includes spin-coating a mask material on the metal material layer 700, and patterning the mask material by exposing and developing to form the first mask layer 910. For example, patterning the metal material layer 700 includes etching the metal material layer 700.

In some examples, as illustrated in FIG. 1, FIG. 9, and FIG. 14A to FIG. 14E, the manufacturing method further includes patterning the functional material layer 800 at positions other than the metal layer 640 to form the first functional layer 630 of the electrode structure 300 and the second functional layer 650 of the second comb tooth portion 120, and the resistivities of both the first functional layer 630 and the second functional layer 650 are not greater than 0.015 ohm·cm. For example, a second mask layer 920 is formed on the metal layer 640 and the functional material layer 800, and the functional material layer 800 is patterned using the second mask layer 920 as a mask to form the first functional layer 630 and the second functional layer 650. For example, forming the second mask layer 920 includes spin-coating a mask material on the metal layer 640 and the functional material layer 800, and patterning the mask material by exposing and developing to form the second mask layer 920. For example, the etching depth of the functional material layer 800 may be more than 5 microns.

In some examples, as illustrated in FIG. 1, FIG. 9, and FIG. 14A to FIG. 14E, the manufacturing method further includes etching the sacrificial material layer 800 between the second functional layer 650 and the bottom layer 610 to remove the sacrificial material layer 800 between the second functional layer 650 and the bottom layer 610 while retaining the sacrificial layer 620 of the electrode structure 300, so as to form the second comb tooth portion as a suspended structure. For example, the sacrificial material layer 800 may be etched by a wet-etching method or a dry-etching method. For example, the sacrificial material layer 800 between the second functional layer 650 and the bottom layer 610 is etched by using hydrofluoric acid to release the sacrificial material layer in the second comb tooth portion.

For example, the manufacturing method illustrated in FIG. 14A to FIG. 14E adopts two patterning processes, one patterning process is used to form the metal layer 640, and the other patterning process is used to form the first functional layer 630 and the second functional layer 650.

Figure 15A:
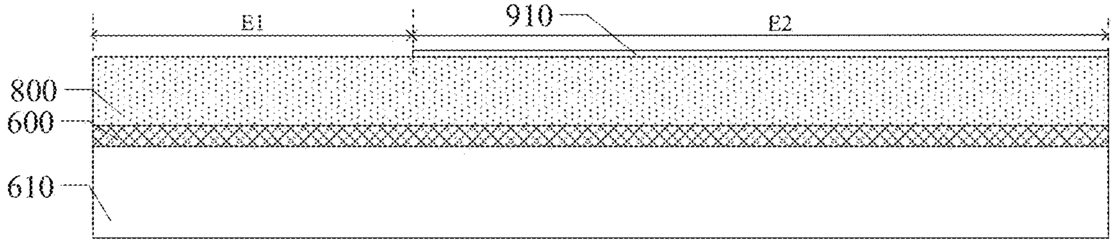
FIG. 15A and FIG. 15B are flowcharts of a manufacturing process for forming a comb tooth structure, a spring structure, and an electrode structure provided according to another example of the embodiments of the present disclosure.
Figure 15B:
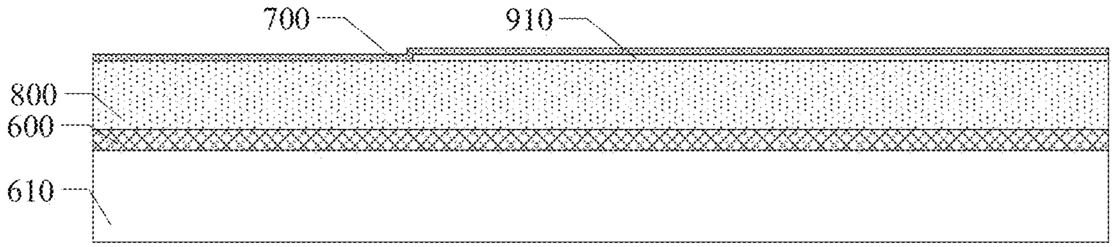

FIG. 15A and FIG. 15B are flowcharts of a manufacturing process for forming a comb tooth structure, a spring structure, and an electrode structure provided according to another example of the embodiments of the present disclosure. The micro-electro-mechanical system formed by the flowcharts is the micro-electro-mechanical system illustrated in FIG. 9.

In some examples, as illustrated in FIG. 1, FIG. 9, FIG. 15A and FIG. 15B, the manufacturing method of patterning the substrate to form the comb tooth structure, the spring structure, and the electrode structure includes: forming a mask layer 910 in a region on a side of the functional material layer 800 away from the sacrificial material layer 600, in which the side of the functional material layer 800 away from the sacrificial material layer 600 includes a first region E1 and a second region E2; and forming a mask layer 910 in the second region E2.

In some examples, as illustrated in FIG. 1, FIG. 9, FIG. 15A and FIG. 15B, the manufacturing method further includes forming the metal material layer 700 in the first region E1 and the second region E2. For example, the metal material layer 700 is formed on a side of the mask layer 910 away from the functional material layer 800 and in the second region E2.

Figure 14A:
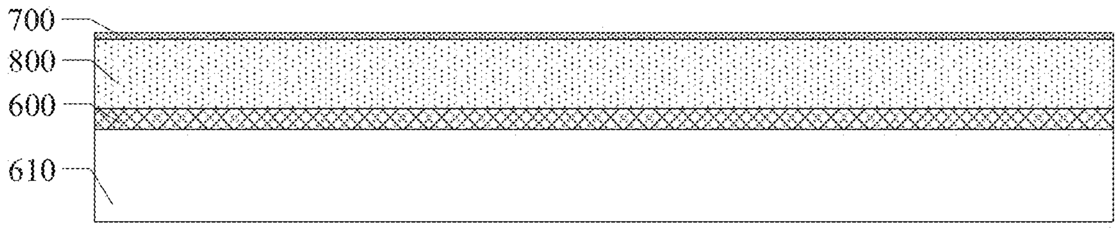
FIG. 14A to FIG. 14E are flowcharts of a manufacturing process for forming a comb tooth structure, a spring structure, and an electrode structure provided according to an example of the embodiments of the present disclosure.
Figure 14B:
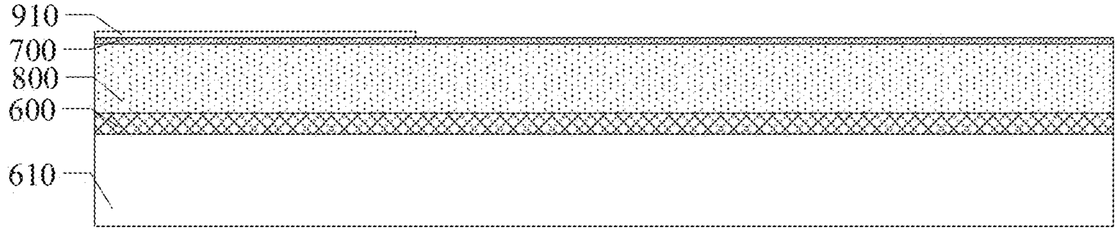
Figure 14C:
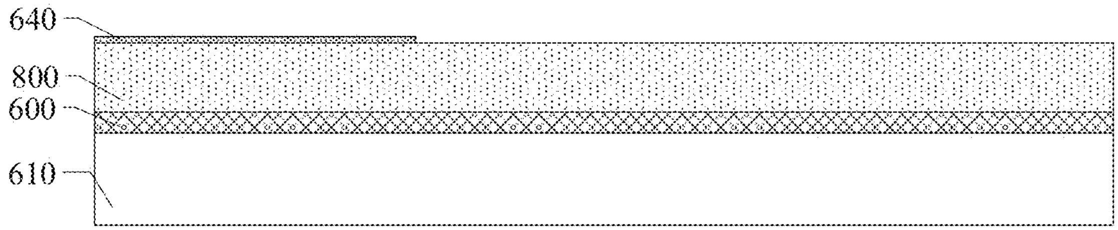
Figure 14D:
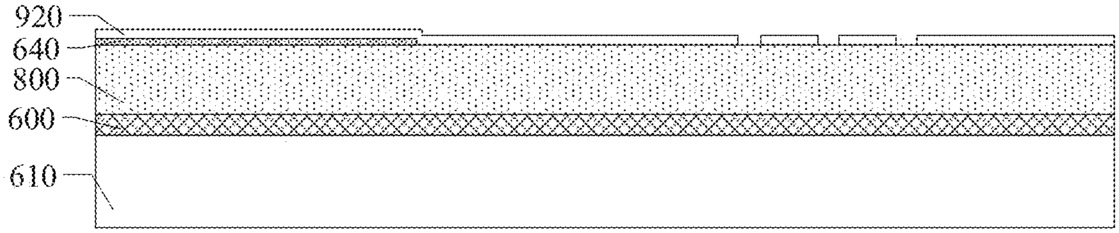
Figure 14E:
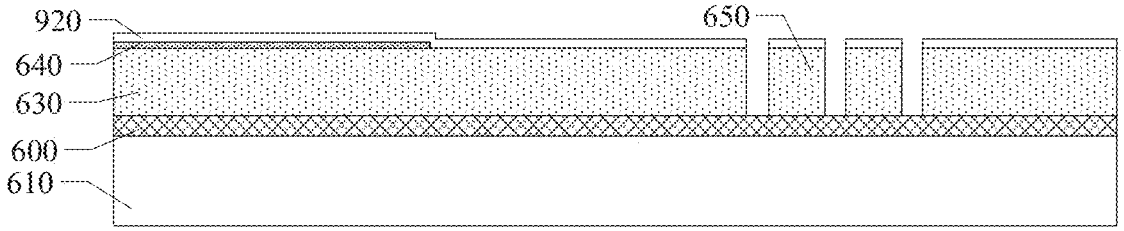

The processes of forming the first functional layer, the second functional layer and etching the sacrificial material layer in the manufacturing processes illustrated in FIG. 15A and FIG. 15B are the same as the manufacturing processes illustrated in FIG. 14D and FIG. 14E, which will not be repeated here.

In some examples, as illustrated in FIG. 1, FIG. 9, FIG. 15A, FIG. 15B, and FIG. 14C, the manufacturing method further includes removing the mask layer 910 and a portion of the metal material layer 700 on the mask layer 910, and retaining a portion of the metal material layer 700 in the first region E1 to form the metal layer 640 of the electrode structure 300.

In the manufacturing method provided in the present example, the metal material layer does not need an etching process, and the process of the metal material layer may be completed by utilizing the positive and negative conversion characteristics of the photoresist AZ5214E. For example, the process of stripping the photoresist can strip the photoresist and a portion of the metal material layer thereon together.

For example, the photoresist AZ5214E consists of three parts: photosensitive components, resin, and solvent. When the mask is exposed, the photosensitive components in the exposed region of the mask is transformed into carboxyl, which is hydrophilic and soluble in an alkaline developer; reverse baking causes the resin part to undergo a cross-linking reaction at a relatively high temperature, and the carboxyl generated above can promote the cross-linking reaction. The cross-linking reaction in the exposed region is much more than that in the unexposed region, as a result, after partial exposure, the mask of the exposed region is less soluble than the mask of the unexposed region, so that the mask of the unexposed region is developed and removed, while the mask of the exposed region is left to achieve image flipping.

The process adopted in the present example is a metal-lift-off process. First, the photoresist coated on the functional material layer is exposed in a pattern, and developed to remove the exposed photoresist, and then a metal material layer is formed on the exposed photoresist. Finally, the remaining photoresist and the metal material layer thereon are stripped together, and the remaining metal material layer on the functional material layer is the metal layer.

In some examples, as illustrated in FIG. 1, FIG. 9, FIG. 15A, FIG. 15B, FIG. 14C, and FIG. 14D, the functional material layer 800 at positions other than the metal layer 640 is patterned to form the first functional layer 630 of the electrode structure 300 and the second functional layer 650 of the second comb tooth portion 120, the second comb tooth portion 120 is in the second region E2, and the resistivities of both the first functional layer 630 and the second functional layer 650 are not greater than 0.015 ohm·cm. The sacrificial material layer 600 between the second functional layer 650 and the bottom layer 610 is etched to remove the sacrificial material layer 600 between the second functional layer 650 and the bottom layer 610 while retaining the sacrificial layer 620 of the electrode structure 300.

The method for etching the sacrificial material layer in the present example may be the same as that in the above-mentioned example, and will not be repeated here.

Figure 16A:
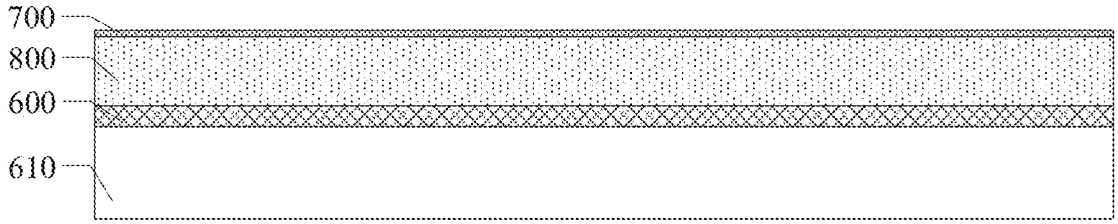
FIG. 16A to FIG. 16C are flowcharts of a manufacturing process for forming a comb tooth structure, a spring structure, and an electrode structure provided according to another example of the embodiments of the present disclosure.
Figure 16B:
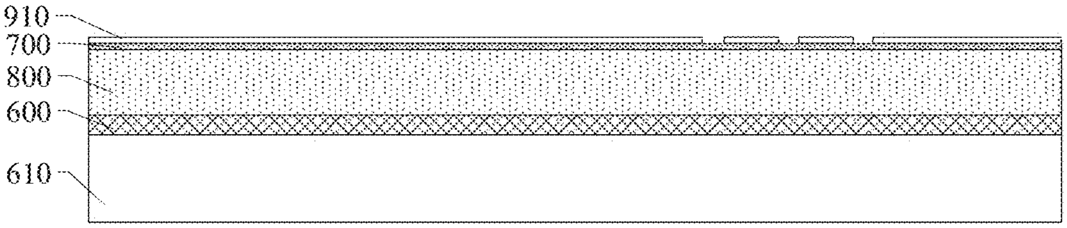
Figure 16C:
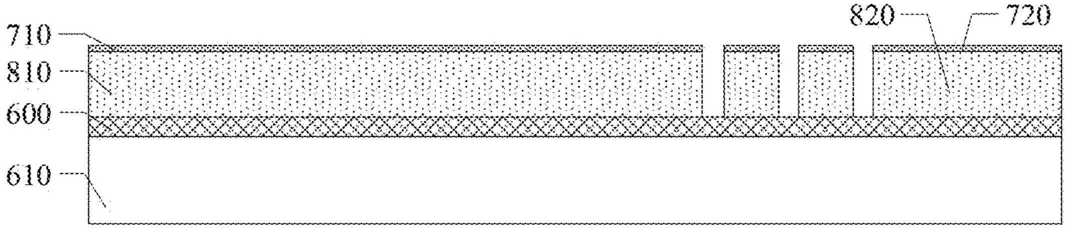

FIG. 16A to FIG. 16C are flowcharts of a manufacturing process for forming a comb tooth structure, a spring structure, and an electrode structure provided according to another example of the embodiments of the present disclosure. The micro-electro-mechanical system formed by the flowcharts is the micro-electro-mechanical system illustrated in FIG. 10.

In some examples, as illustrated in FIG. 1, FIG. 10, and FIG. 16A to FIG. 16C, the manufacturing method of patterning the substrate to form the comb tooth structure, the spring structures, and the electrode structure includes: forming a metal material layer 700 on a side of the functional material layer 800 away from the sacrificial material layer 600, for example, sputtering or depositing a metal material on the functional material layer 800 to form the metal material layer 700.

In some examples, as illustrated in FIG. 1, FIG. 10, and FIG. 16A to FIG. 16C, the manufacturing method further includes patterning the metal material layer 700 to form the first metal layer 710 of the electrode structure 300 and the second metal layer 720 of the second comb tooth portion 120. For example, a first mask layer 910 is formed on the metal material layer 700, and the metal material layer 700 is patterned using the first mask layer 910 as a mask to form the first metal layer 710 and the second metal layer 720. For example, forming the first mask layer 910 includes spin-coating a mask material on the metal material layer 700, and patterning the mask material by exposing and developing to form the first mask layer 910. For example, patterning the metal material layer 700 includes etching the metal material layer 700.

In some examples, as illustrated in FIG. 1, FIG. 10, and FIG. 16A to FIG. 16C, the manufacturing method further includes patterning the functional material layer 800 at positions other than the first metal layer 710 and the second metal layer 720 to form the first functional layer 810 of the electrode structure 300 and the second functional layer 820 of the second comb tooth portion 120. For example, the resistivities of the first functional layer 810 and the second functional layer 820 are both 1-10 ohm·cm. For example, the materials of the first functional layer 810 and the second functional layer 820 are both high-resistance silicon. For example, the thickness of the first functional layer 810 is identical to the thickness of the second functional layer 820, for example, the thickness is 3-10 microns, such as 4-9 microns, such as 5-8 microns, such as 6-7 microns. Of course, the present example is not limited thereto, the resistivities of the first functional layer 810 and the second functional layer 820 may both not be greater than 0.015 ohm·cm, for example, the first functional layer 810 and the second functional layer 820 may both be low-resistance silicon.

In some examples, as illustrated in FIG. 1, FIG. 10, and FIG. 16A to FIG. 16C, the sacrificial material layer 600 between the second functional layer 820 and the bottom layer 610 is etched to remove the sacrificial material layer 600 between the second functional layer 820 and the bottom layer 610 while retaining the sacrificial layer 620 of the electrode structure 300.

The method for etching the sacrificial material layer in the present example may be the same as that in the above-mentioned example, and will not be repeated here.

The manufacturing method illustrated in FIG. 16A to FIG. 16C uses one patterning process to form the first metal layer, the second metal layer, the first functional layer and the second functional layer, which saves process steps.

Figure 17A:
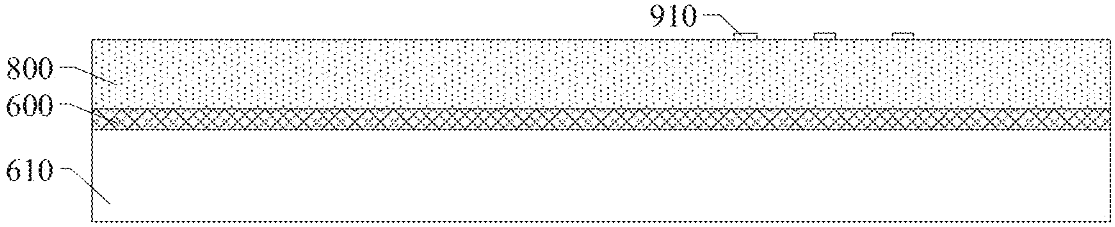
FIG. 17A to FIG. 17C are flowcharts of a manufacturing process for forming a comb tooth structure, a spring structure, and an electrode structure provided according to another example of the embodiments of the present disclosure.
Figure 17B:
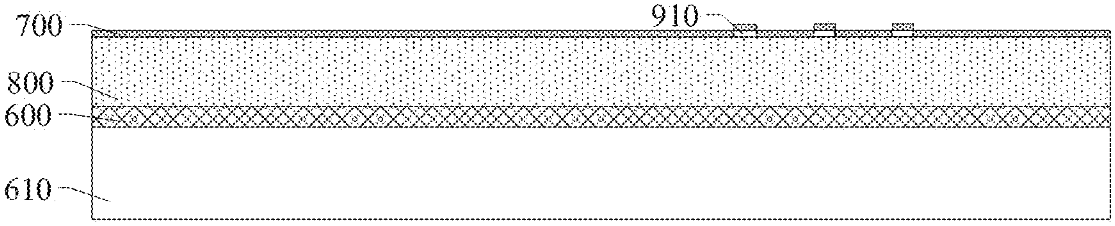
Figure 17C:
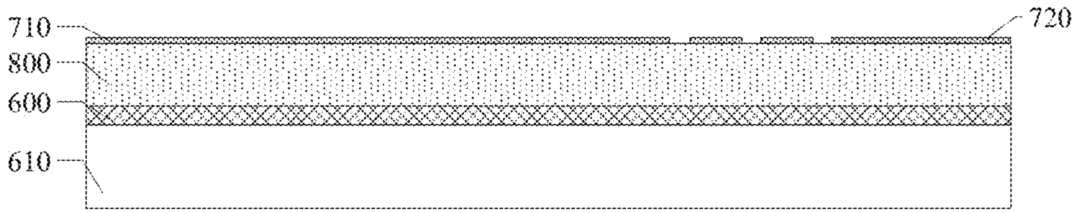

FIG. 17A to FIG. 17C are flowcharts of a manufacturing process for forming a comb tooth structure, a spring structure, and an electrode structure provided according to another example of the embodiments of the present disclosure. The micro-electro-mechanical system formed by the flowcharts is the micro-electro-mechanical system illustrated in FIG. 10.

The difference between the manufacturing method illustrated in FIG. 17A to FIG. 17C and the manufacturing method illustrated in FIG. 16A to FIG. 16C lies in the step of patterning the metal layer. For example, as illustrated in FIG. 1, FIG. 10 and FIG. 17A to FIG. 17C, a mask layer 910 is formed by patterning in some regions on a side of the functional material layer 800 away from the sacrificial material layer 600, a metal material layer 700 covering the mask layer 910 and the functional material layer 800 exposed by the mask layer 910 is formed on a side of the mask layer 910 away from the functional material layer 800, and the above-mentioned mask layer 910 is stripped to strip the mask layer 910 and a portion of the metal layer on the mask layer 910 together to form the first metal layer 710 and the second metal layer 720 illustrated in FIG. 17C.

The process adopted in the present example is a lift-off process, such as a stripping process, so that the metal material layer can be patterned without an etching process.

Figure 18A:
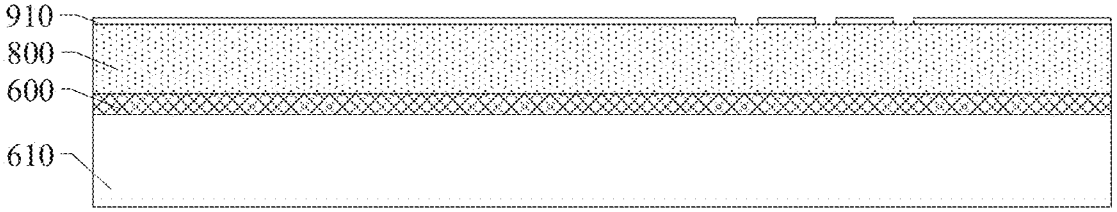
FIG. 18A and FIG. 18B are flowcharts of a manufacturing process for forming a comb tooth structure, a spring structure, and an electrode structure provided according to another example of the embodiments of the present disclosure.
Figure 18B:
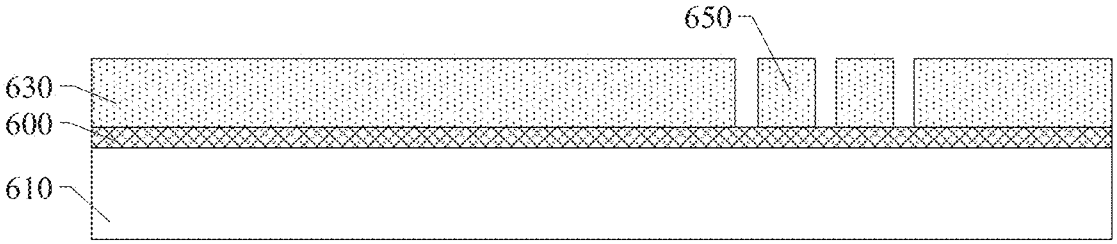

FIG. 18A and FIG. 18B are flowcharts of a manufacturing process for forming a comb tooth structure, a spring structure, and an electrode structure provided according to another example of the embodiments of the present disclosure. The micro-electro-mechanical system formed by the flowcharts is the micro-electro-mechanical system illustrated in FIG. 11.

In some examples, as illustrated in FIG. 1, FIG. 11, FIG. 18A, and FIG. 18B, the manufacturing method of patterning the substrate to form the comb tooth structure, the spring structure and the electrode structure includes patterning the functional material layer 800 to form the first functional layer 630 of the electrode structure 300 and the second functional layer 650 of the second comb tooth portion 120, and the resistivities of both the first functional layer 630 and the second functional layer 650 are not greater than 0.015 ohm·cm. For example, a first mask layer 910 is formed on the functional material layer 800, and the functional material layer 800 is patterned using the first mask layer 910 as a mask to form the first functional layer 630 and the second functional layer 650. For example, forming the first mask layer 910 includes spin-coating a mask material on the functional material layer 800, and patterning the mask material by exposing and developing to form the first mask layer 910. For example, patterning the functional material layer 800 includes performing dry etching on the functional material layer 800. For example, the material of the functional material layer 800 includes low-resistance silicon. For example, the thickness of the functional material layer 800 may be 5-6 microns.

In some examples, as illustrated in FIG. 1, FIG. 11, FIG. 18A, and FIG. 18B, the manufacturing method further includes etching the sacrificial material layer 600 between the second functional layer 650 and the bottom layer 610 to remove the sacrificial material layer 600 between the second functional layer 650 and the bottom layer 610 while retaining the sacrificial layer 620 of the electrode structure 300.

The method for etching the sacrificial material layer in the present example may be the same as that in the above-mentioned example, and will not be repeated here.

In the micro-electro-mechanical system provided in the present example, the low-resistance silicon functional layer is directly used as the functional layer of the second comb tooth portion and the electrode structure, without adding a metal layer, which is beneficial to reduce one step of masking process.

FIG. 19A to FIG. 19E are flowcharts of a manufacturing process for forming a comb tooth structure, a spring structure, and an electrode structure provided according to another example of the embodiments of the present disclosure. The micro-electro-mechanical system formed by the flowcharts is the micro-electro-mechanical system illustrated in FIG. 12.

In some examples, as illustrated in FIG. 1, FIG. 12, and FIG. 19A to FIG. 19E, the manufacturing method of patterning the substrate to form the comb tooth structure, the spring structure and the electrode structure includes patterning the functional material layer 800 to form the first functional layer 810 of the electrode structure 300 and the second functional layer 820 of the second comb tooth portion 120. For example, the resistivities of the first functional layer 810 and the second functional layer 820 are both 1-10 ohm·cm. For example, the material of the functional material layer 800 includes high-resistance silicon. For example, the resistivities of both the first functional layer and the second functional layer are not greater than 0.015 ohm·cm. For example, the material of the functional material layer 800 may include low-resistance silicon.

For example, as illustrated in FIG. 19A to FIG. 19E, a first mask layer 910 is formed on the functional material layer 800, and the functional material layer 800 is patterned using the first mask layer 910 as a mask to form the first functional layer 810 and the second functional layer 820. For example, forming the first mask layer 910 includes spin-coating a mask material on the functional material layer 800, and patterning the mask material by exposing and developing to form the first mask layer 910. For example, patterning the functional material layer 800 includes performing dry-etching on the functional material layer 800.

In some examples, as illustrated in FIG. 1, FIG. 12, and FIG. 19A to FIG. 19E, the manufacturing method further includes forming a metal material layer 700 on the first functional layer 810 and the second functional layer 820. For example, after the first mask layer 910 is removed, a metal material is deposited on the first functional layer 810, the second functional layer 820 and the sacrificial material layer 600 exposed by the functional layers to form the metal material layer 700.

In some examples, as illustrated in FIG. 1, FIG. 12, and FIG. 19A to FIG. 19E, the manufacturing method further includes patterning the metal material layer 700 to form the first metal layer 710 of the electrode structure 300 and the second metal layer 720 of the second comb tooth portion 120, the first metal layer 710 is on a surface of the first functional layer 810 away from the bottom layer 610 and on at least part of a side surface of the first functional layer 810, and the second metal layer 710 is on a surface of the second functional layer 820 away from the bottom layer 610 and on at least part of a side surface of the second functional layer 820. For example, the second mask layer 920 is formed by patterning on the surface of the metal material layer 700, and the second mask layer 920 is provided with an opening 921 in the interval between the comb teeth to etch the metal material layer 700.

Figure 19A:
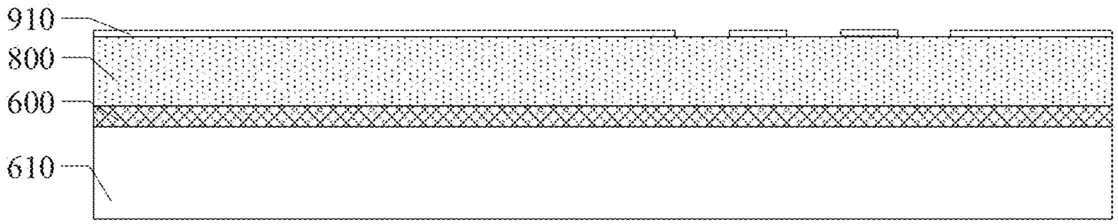
FIG. 19A to FIG. 19E are flowcharts of a manufacturing process for forming a comb tooth structure, a spring structure, and an electrode structure provided according to another example of the embodiments of the present disclosure.
Figure 19B:
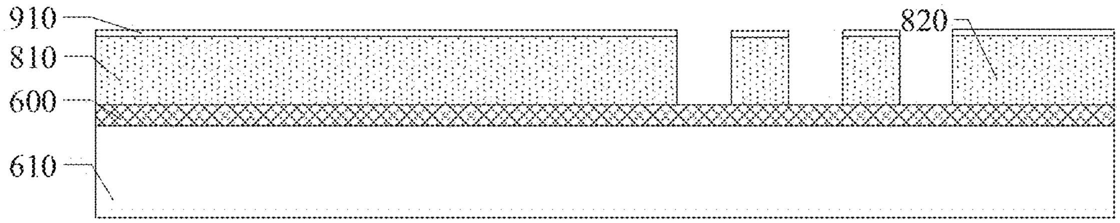
Figure 19C:
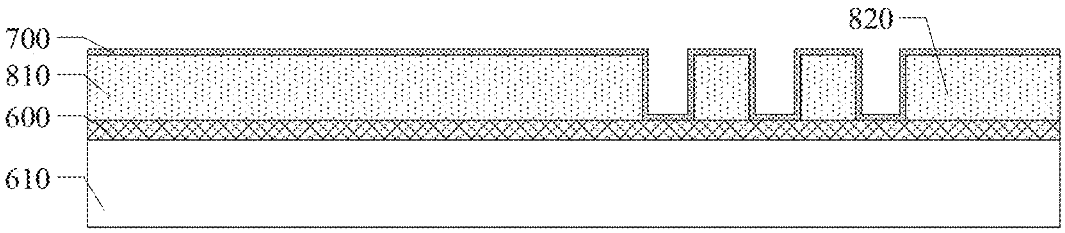
Figure 19D:
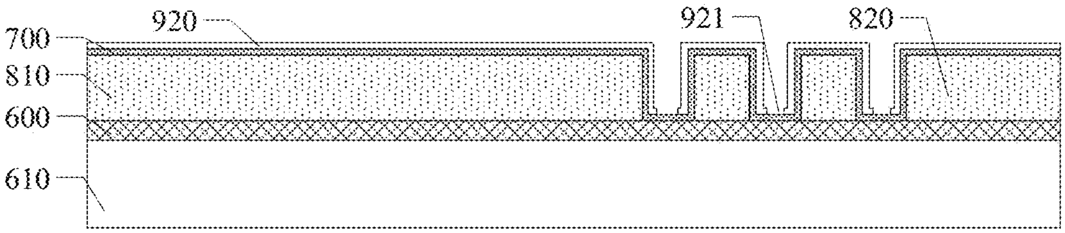
Figure 19E:
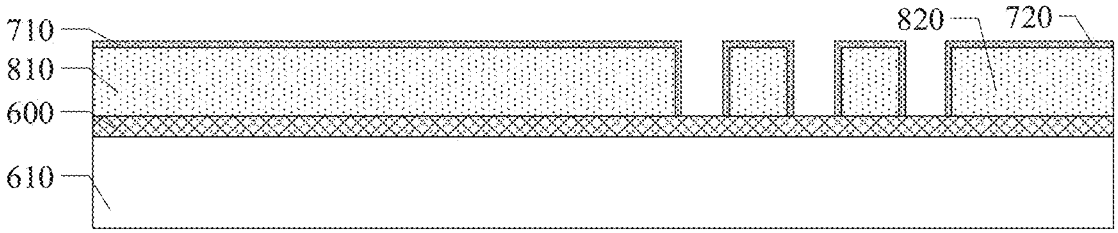

For example, as illustrated in FIG. 19D, the metal layer 700 on the side surfaces of the first functional layer 810 and the second functional layer 820 is covered by the second mask layer 920 to prevent the metal layer 700 on the side surfaces from being etched. For example, the material of the metal material layer 700 includes copper or molybdenum to prevent reaction with hydrofluoric acid used to etch the sacrificial material layer 600 subsequently.

For example, as illustrated in FIG. 19D, the size of the opening 921 is smaller than the interval between the comb teeth. For example, the size of the opening 921 is 1-2 microns smaller than the size of the above-mentioned interval.

In some examples, as illustrated in FIG. 1, FIG. 12, and FIG. 19A to FIG. 19E, the sacrificial material layer 600 between the second functional layer 820 and the bottom layer 610 is etched to remove the sacrificial material layer 600 between the second functional layer 820 and the bottom layer 610 while retaining the sacrificial layer 620 of the electrode structure 300.

The method for etching the sacrificial material layer in the present example may be the same as that in the above-mentioned example, and will not be repeated here.

In the embodiments of the present disclosure, the support portion of the first comb tooth portion and the fixing portion of the spring structure may be prepared by the same method as the electrode structure, and the first comb tooth of the first comb tooth portion, the spring body of the spring structure and the baffle may be prepared by the same method as the second comb tooth portion, which will not be repeated herein.

The present disclosure provides various examples to manufacture the above-mentioned micro-electro-mechanical system to achieve the integration, miniaturization, etc. of the micro-electro-mechanical system, and achieve the movement of the second comb tooth portion.

The following statements should be noted:

(1) The drawings of the present disclosure involve only the structure(s) in connection with the embodiment(s) of the present disclosure, and other structure(s) can be referred to common design(s).

(2) In case of no conflict, features in one embodiment or in different embodiments can be combined to obtain new embodiments.

What have been described above are only exemplary embodiments of the present disclosure, and are not intended to limit the protection scope of the present disclosure, and the protection scope of the present disclosure is determined by the appended claims.

The invention claimed is:

1. A micro-electro-mechanical system, comprising:

a comb tooth structure, comprising a first comb tooth portion and a second comb tooth portion, wherein the first comb tooth portion comprises a plurality of first comb teeth arranged along a first direction and extending along a second direction, the second comb tooth portion comprises a plurality of second comb teeth arranged along the first direction and extending along the second direction, at least part of the plurality of second comb teeth are in intervals of the plurality of first comb teeth so that the plurality of first comb teeth and at least part of the plurality of second comb teeth are arranged alternately, the second comb tooth portion is a suspended structure and configured to be movable in the second direction relative to the first comb tooth portion, and the first direction intersects with the second direction;

a spring structure, connected to the second comb tooth portion;

an electrode structure, comprising a first electrode, a second electrode, a first electrode line and a second electrode line, wherein the first electrode is electrically connected to the first comb tooth portion through the first electrode line, and the second electrode is electrically connected to the second comb tooth portion through the second electrode line, wherein the second comb tooth portion further comprises a cantilever beam connecting the plurality of second comb teeth, and the cantilever beam is connected to the spring structure;

a line width of a first comb tooth and a line width of a second comb tooth are both 3-7 microns, both the line width of the first comb tooth and the line width of the second comb tooth are not less than a distance between the first comb tooth and the second comb tooth that are adjacent, a ratio of a length of an overlapping portion of orthographic projections, on a plane, of the first comb tooth and the second comb tooth that are adjacent to a length of the first comb tooth is 5%-50%, a ratio of the length of the first comb tooth to a length of the second comb tooth is 0.7-1.5, a width of the cantilever beam is not less than the line width of the second comb tooth, a thickness of the first comb tooth and a thickness of the second comb tooth are both 300 nanometers to 500 microns, and the plane is parallel to the second direction and perpendicular to the first direction.

2. The micro-electro-mechanical system according to claim 1, wherein a line width of the first electrode line and a line width of the second electrode line are both more than 10 times the width of the cantilever beam, and a maximum size of the first electrode and a maximum size of the second electrode are both 1-50 mm.

3. The micro-electro-mechanical system according to claim 1, wherein the distance between the first comb tooth and the second comb tooth that are adjacent is 2-4 microns.

4. The micro-electro-mechanical system according to claim 1, wherein the spring structure comprises a spring body on either side of the cantilever beam in the first direction, the spring body is connected to the cantilever beam, and the spring body is a suspended structure;

the spring body extends along the first direction, a line width of the spring body is 3-5 microns, a ratio of a length of a spring body on a same side of the cantilever beam to a length of the cantilever beam is 0.5-3, and a total number of the spring body on the same side of the cantilever beam is 1-6.

5. The micro-electro-mechanical system according to claim 4, wherein the spring structure is a conductive structure, the spring structure further comprises a fixing portion connected to an end of the spring body away from the cantilever beam, and two ends of the second electrode line are electrically connected to the second electrode and the fixing portion, respectively; and a ratio of a size of the fixing portion in the first direction to a line width of the second electrode line is not less than 2.

6. The micro-electro-mechanical system according to claim 1, wherein a line width of at least a partial position of at least one first comb tooth is greater than a line width of the at least one second comb tooth; and/or, a thickness of at least a partial position of at least one first comb tooth is greater than a thickness of at least one second comb tooth.

7. The micro-electro-mechanical system according to claim 1, wherein the first comb tooth portion further comprises a support portion connected to the plurality of first comb teeth, and a ratio of a size of the support portion in the second direction to the line width of the first comb tooth is not less than 5.

8. The micro-electro-mechanical system according to claim 1, wherein the cantilever beam is provided with at least one first via, a maximum size of an orthographic projection of the first via on a plane parallel to the first direction and the second direction is not less than 3 microns, and a distance between an edge of the first via and any edge of the cantilever beam is greater than 2 microns.

9. The micro-electro-mechanical system according to claim 1, wherein a baffle is provided on a side of the cantilever beam away from the plurality of second comb teeth, the baffle is a suspended structure, the baffle is provided with at least one second via, and a maximum size of an orthographic projection of the second via on a plane parallel to the first direction and the second direction is not less than 3 microns.

10. The micro-electro-mechanical system according to claim 1, wherein a plurality of notches are provided on at least one side edge, extending along the second direction, of at least one of at least one kind of the plurality of first comb teeth and the plurality of second comb teeth, and the plurality of notches are provided evenly.

11. The micro-electro-mechanical system according to claim 1, wherein the electrode structure comprises a metal layer, a first functional layer, and a sacrificial layer stacked sequentially, the second comb tooth portion comprises a second functional layer, the first functional layer and the second functional layer are provided in a same layer and made of a same material, and resistivities of both the first functional layer and the second functional layer are not greater than 0.015 ohm·cm.

12. The micro-electro-mechanical system according to claim 1, wherein the electrode structure comprises a first metal layer, a first functional layer, and a sacrificial layer stacked sequentially, the second comb tooth portion comprises a second metal layer and a second functional layer stacked with each other, the first metal layer and the second metal layer are provided in a same layer and made of a same material, and the first functional layer and the second functional layer are provided in a same layer and made of a same material.

13. The micro-electro-mechanical system according to claim 1, wherein the electrode structure comprises a first functional layer and a sacrificial layer stacked sequentially, the second comb tooth portion comprises a second functional layer, the first functional layer and the second functional layer are provided in a same layer and made of a same material, and resistivities of both the first functional layer and the second functional layer are not greater than 0.015 ohm·cm.

14. The micro-electro-mechanical system according to claim 1, wherein the electrode structure comprises a first functional layer and a sacrificial layer stacked with each other, and a first metal layer is provided on a side surface of the first functional layer away from the sacrificial layer and on at least part of a side surface of the first functional layer;

the second comb tooth portion comprises a second functional layer and a second metal layer stacked with each other, and the second metal layer is provided on at least part of a side surface of the second functional layer; and the first functional layer and the second functional layer are provided in a same layer and made of a same material, and the first metal layer and the second metal layer are made of a same material.

15. The micro-electro-mechanical system according to claim 12, wherein resistivities of both the first functional layer and the second functional layer are 1-10 ohm·cm.

16. A manufacturing method for manufacturing the micro-electro-mechanical system according to claim 1, comprising:

providing a substrate, wherein the substrate comprises a bottom layer, a sacrificial material layer, and a functional material layer stacked sequentially; and patterning the substrate to form the comb tooth structure, the spring structure and the electrode structure.

17. The manufacturing method according to claim 16, wherein patterning the substrate to form the comb tooth structure, the spring structure and the electrode structure comprises:

forming a metal material layer on a side of the functional material layer away from the sacrificial material layer;

patterning the metal material layer to form a metal layer of the electrode structure;

patterning the functional material layer at positions other than the metal layer to form a first functional layer of the electrode structure and a second functional layer of the second comb tooth portion, wherein resistivities of both the first functional layer and the second functional layer are not greater than 0.015 ohm·cm; and etching the sacrificial material layer between the second functional layer and the bottom layer to remove the sacrificial material layer between the second functional layer and the bottom layer while retaining a sacrificial layer of the electrode structure.

18. The manufacturing method according to claim 16, wherein patterning the substrate to form the comb tooth structure, the spring structure and the electrode structure comprises:

forming a mask layer in a region on a side of the functional material layer away from the sacrificial material layer, wherein the side of the functional material layer away from the sacrificial material layer comprises a first region and a second region, and the region is the second region;

forming a metal material layer in the first region and the second region;

removing the mask layer and a portion of the metal material layer on the mask layer, and retaining a portion of the metal material layer in the first region to form a metal layer of the electrode structure;

patterning the functional material layer at positions other than the metal layer to form a first functional layer of the electrode structure and a second functional layer of the second comb tooth portion, wherein the second comb tooth portion is in the second region, and resistivities of both the first functional layer and the second functional layer are not greater than 0.015 ohm·cm; and etching the sacrificial material layer between the second functional layer and the bottom layer to remove the sacrificial material layer between the second functional layer and the bottom layer while retaining a sacrificial layer of the electrode structure.

19. The manufacturing method according to claim 16, wherein patterning the substrate to form the comb tooth structure, the spring structure and the electrode structure comprises:

forming a metal material layer on a side of the functional material layer away from the sacrificial material layer;

patterning the metal material layer to form a first metal layer of the electrode structure and a second metal layer of the second comb tooth portion;

patterning the functional material layer at positions other than the first metal layer and the second metal layer to form a first functional layer of the electrode structure and a second functional layer of the second comb tooth portion; and etching the sacrificial material layer between the second functional layer and the bottom layer to remove the sacrificial material layer between the second functional layer and the bottom layer while retaining a sacrificial layer of the electrode structure.

20. The manufacturing method according to claim 16, wherein patterning the substrate to form the comb tooth structure, the spring structure and the electrode structure comprises:

patterning the functional material layer to form a first functional layer of the electrode structure and a second functional layer of the second comb tooth portion, wherein resistivities of both the first functional layer and the second functional layer are not greater than 0.015 ohm·cm; and etching the sacrificial material layer between the second functional layer and the bottom layer to remove the sacrificial material layer between the second functional layer and the bottom layer while retaining a sacrificial layer of the electrode structure; or patterning the substrate to form the comb tooth structure, the spring structure and the electrode structure comprises:

patterning the functional material layer to form a first functional layer of the electrode structure and a second functional layer of the second comb tooth portion;

forming a metal material layer on the first functional layer and the second functional layer;

patterning the metal material layer to form a first metal layer of the electrode structure and a second metal layer of the second comb tooth portion, wherein the first metal layer is on a surface of the first functional layer away from the bottom layer and on at least part of a side surface of the first functional layer, and the second metal layer is on a surface of the second functional layer away from the bottom layer and on at least part of a side surface of the second functional laver; and etching the sacrificial material layer between the second functional layer and the bottom layer to remove the sacrificial material layer between the second functional layer and the bottom layer while retaining a sacrificial layer of the electrode structure.

* * * * *